(12) United States Patent
Eldridge et al.

(10) Patent No.: US 7,898,242 B2
(45) Date of Patent: Mar. 1, 2011

(54) PROBE CARD ASSEMBLY WITH AN INTERCHANGEABLE PROBE INSERT

(75) Inventors: Benjamin N. Eldridge, Danville, CA (US); Carl V. Reynolds, Pleasanton, CA (US); Nobuhiro Kawamata, Ishioka (JP); Takao Saeki, Yokohama (JP)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 12/396,661

(22) Filed: Mar. 3, 2009

(65) Prior Publication Data

US 2009/0160432 A1 Jun. 25, 2009

Related U.S. Application Data

(62) Division of application No. 11/306,270, filed on Dec. 21, 2005, now Pat. No. 7,498,825.

(60) Provisional application No. 60/595,480, filed on Jul. 8, 2005.

(51) Int. Cl.
*G01R 31/28* (2006.01)
(52) U.S. Cl. .................................. 324/158.1
(58) Field of Classification Search .............. 324/754, 324/761–762, 765, 158.1; 438/14–18; 257/48
See application file for complete search history.

(56) References Cited

U.S. PATENT DOCUMENTS

| | | | |
|---|---|---|---|
| 6,292,003 B1 * | 9/2001 | Fredrickson et al. ........ | 324/754 |
| 6,600,334 B1 | 7/2003 | Hembree et al. | |
| 6,815,961 B2 | 11/2004 | Mok et al. | |
| 6,965,244 B2 * | 11/2005 | Miller ........................ | 324/754 |
| 7,102,367 B2 * | 9/2006 | Yamagishi et al. .......... | 324/754 |
| 7,498,825 B2 | 3/2009 | Eldridge et al. | |
| 2001/0054906 A1 | 12/2001 | Fujimura | |
| 2007/0139061 A1 | 6/2007 | Eldridge | |

* cited by examiner

*Primary Examiner*—Ha Tran T Nguyen
*Assistant Examiner*—Tung X Nguyen
(74) *Attorney, Agent, or Firm*—Kirton & McConkie

(57) ABSTRACT

A probe card assembly can include an insert holder configured to hold a probe insert, which can include probes disposed in a particular configuration for probing a device to be tested. The probe card assembly can provide an electrical interface to a tester that can control testing of the device, and while attached to the probe card assembly, the insert holder can hold the probe insert such that the probe insert is electrically connected to electrical paths within the probe card assembly that are part of the interface to the tester. The insert holder can be detached from the probe card assembly. The probe insert of the probe card assembly can be replaced by detaching the insert holder, replacing the probe insert with a new probe insert, and then reattaching the insert holder to the probe card assembly. The probe insert and holder can be integrally formed and comprise a single structure that can be detached from a probe card assembly and replaced with a different probe insert and holder.

15 Claims, 20 Drawing Sheets

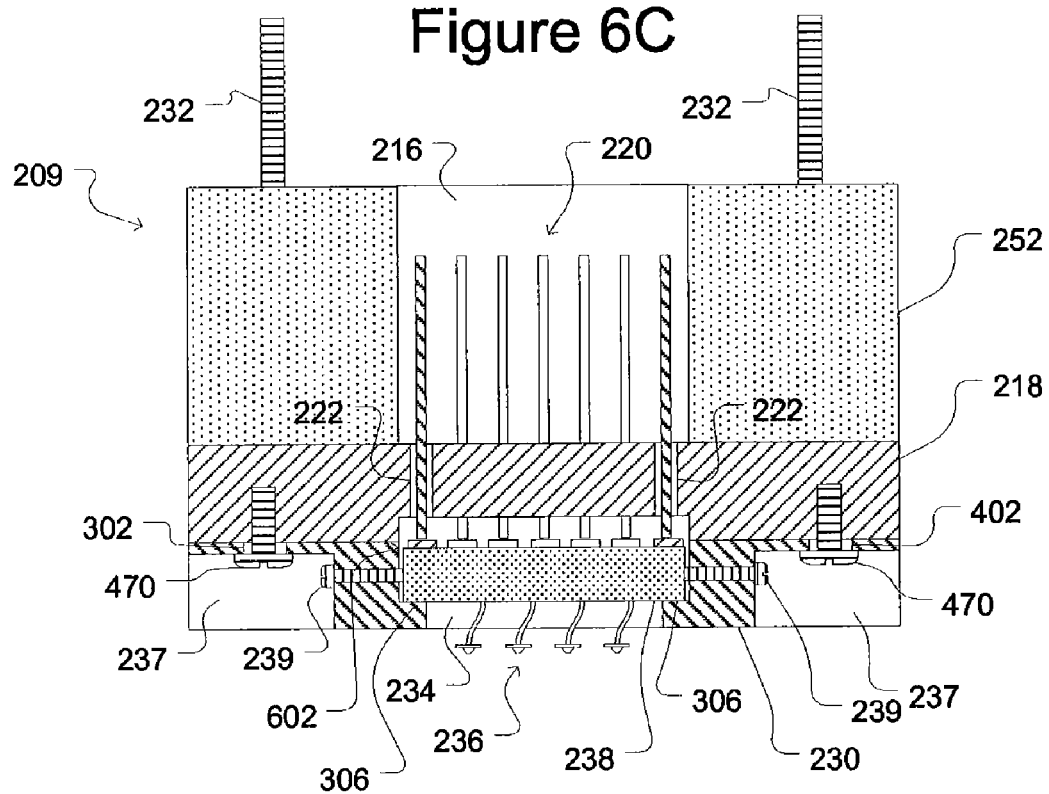
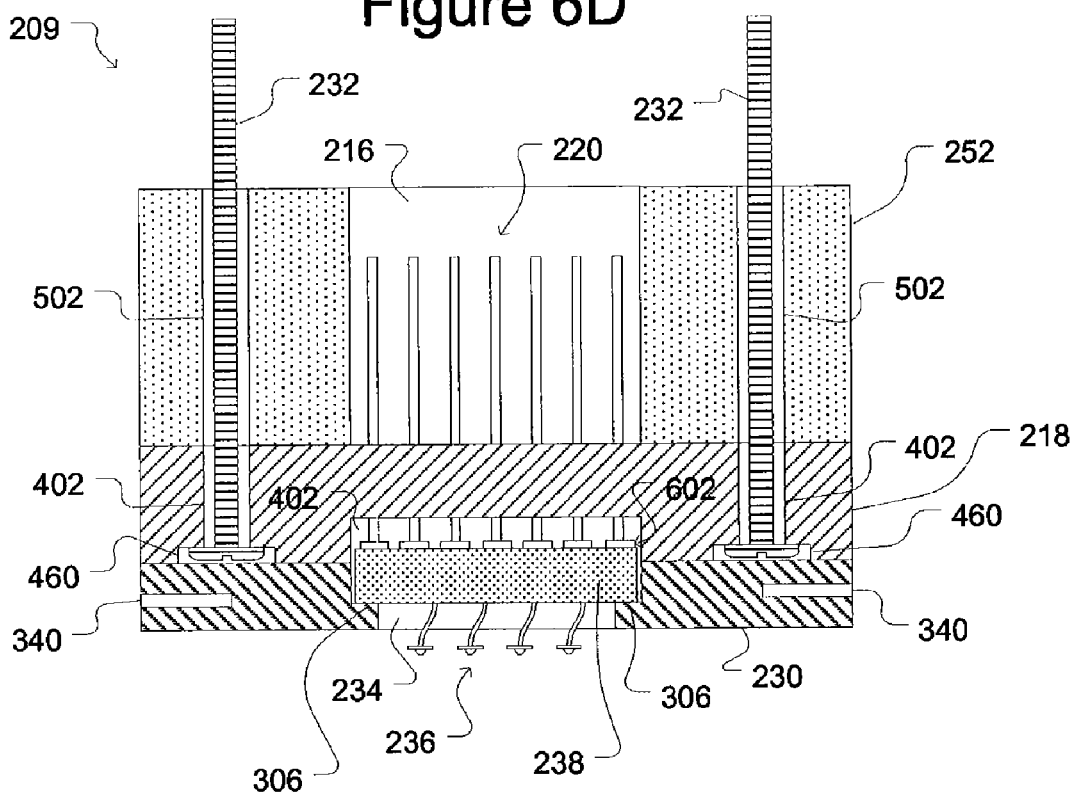

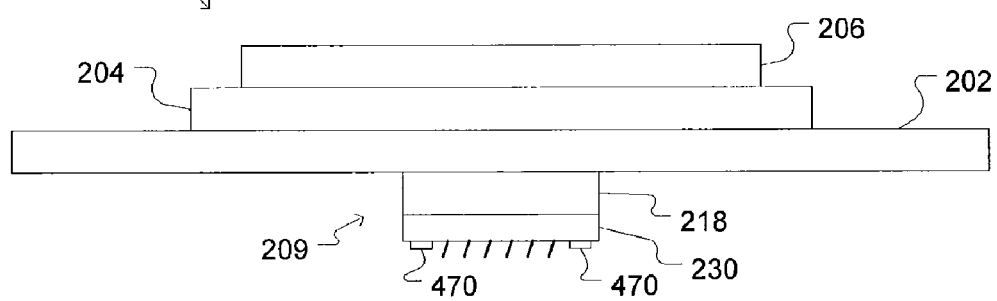
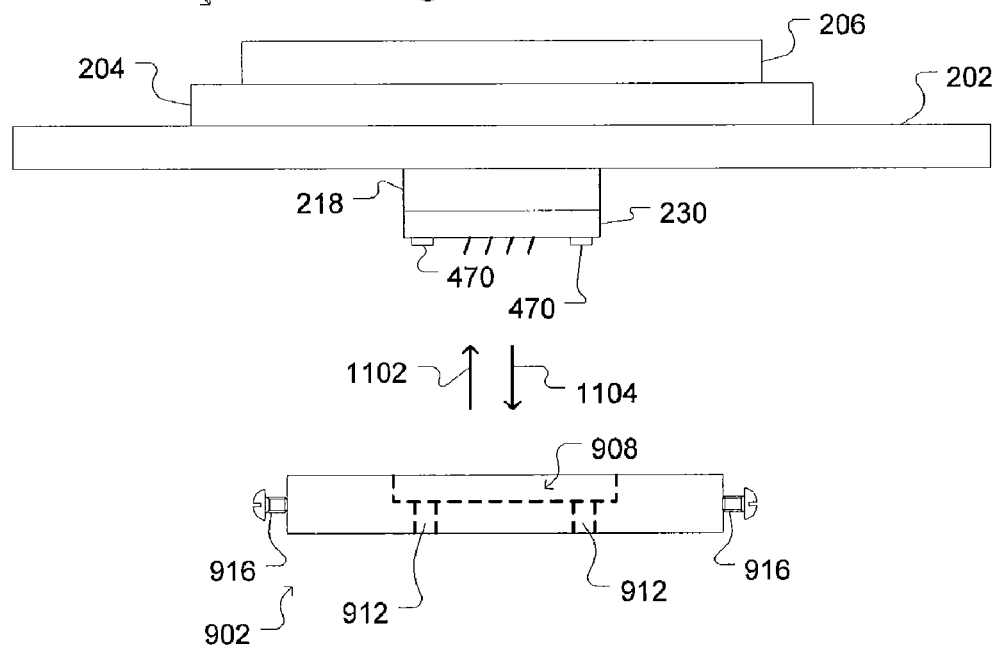

PROBE CARD ASSEMBLY WITH AN INTERCHANGEABLE PROBE INSERT

CROSS-REFERENCE TO RELATED APPLICATION(S)

This application is a division of U.S. patent application Ser. No. 11/306,270, filed Dec. 21, 2005 (now U.S. Pat. No. 7,498,825), which claims the benefit of U.S. provisional patent application Ser. No. 60/595,480, filed Jul. 8, 2005. The foregoing U.S. patent application Ser. No. 11/306,270 is incorporated herein by reference in its entirety.

BACKGROUND

FIG. 1A illustrates an exemplary prior art probing system used to test a device under test ("DUT") 112, which may be, for example, one or more dies (not shown) on a newly manufactured semiconductor wafer or other electronic devices (e.g., previously manufactured dies). The probing system of FIG. 1A can include a test head 104 and a prober 102 (which is shown with a cut-away 126 to provide a partial view of the inside of the prober 102). To test DUT 112, the DUT is placed on a moveable stage 106 as shown in FIG. 1A, and the stage 106 is moved such that input and/or output terminals of the DUT 112 are brought into contact with probes 124 of a probe card assembly 108, which as shown, is attached to a test head plate 121. For example, the probe card assembly 108 may be bolted or clamped to the test head plate 121 with the probe substrate 122 and probes 124 extending into the prober 102 through opening 132 (see FIG. 1B).

Typically, a cable 110 or other communication means connects a tester (not shown) with the test head 104. The tester (not shown) generates test data to be written to the DUT 112, and the tester receives and evaluates response data generated by the DUT 112 in response to the test data. The cable 110 can provide a plurality of communications channels (not shown) to and from the tester (not shown) for such test and response data. Typically, there can be a communications channel (not shown) for each input and/or output terminal of the DUT 112, and there may be further communications channels for providing power and ground to the DUT 112.

The test head 104 and test head connectors 114 provide electrical connections that connect the tester channels (not shown) to the probe card assembly 108. The probe card assembly 108 shown in FIG. 1A can include a wiring board 120 and a probe substrate 122. The wiring board 120 provides electrical connections (not shown) from connectors 114 to a probe substrate 122, and the probe substrate provides electrical connections to the probes 124. The probe card assembly 108 thus provides an interface that connects the tester communications channels (not shown) to the input and/or output terminals (not shown) of a DUT 112.

While terminals (not shown) of DUT 112 are pressed against probes 124 (thus forming electrical connections between the terminals and the probes), the tester (not shown) runs tests on the DUT 112. For example, the tester (not shown) may run functional tests on the DUT 112 in which the DUT can be operated in various modes. Monitoring results of such operation, the tester (not shown) determines whether the DUT 112 functions properly. Such tests may also be used to determine a maximum reliable operating speed of the DUT 112. Parametric tests are another example of tests that may be run on the DUT 112. Parametric tests may include such things as measuring leakage current in the DUT 112, determining whether the DUT 112 has a short-circuit fault or open-circuit fault, etc.

SUMMARY

In an exemplary embodiment of the invention, an insert holder can be configured to hold a probe insert, which can include probes disposed in a particular configuration for probing a device to be tested. The insert holder can be attached to and detached from a probe card assembly, which provides an electrical interface to a tester that controls testing of the device. While attached to the probe card assembly, the insert holder can hold the probe insert such that the probe insert is electrically connected to electrical paths within the probe card assembly that are part of the interface to the tester. While detached from the probe card assembly, the insert holder can allow the probe insert to be removed and replaced with a new probe insert, which may be configured differently than the first probe insert. In some embodiments, the probe insert and probe holder can be integrally formed and comprise a single structure.

DESCRIPTION OF THE DRAWINGS

FIGS. 6C and 6D show side, cross-sectional views of the probe head assembly of FIG. 5.

FIGS. 9A, 9B, and 9C illustrate exemplary changing of an insert according to some embodiments of the invention.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein.

FIGS. 2 and 3A-3C illustrate an exemplary probe card assembly 200 that may be used in a prober or other system for testing electronic devices according to some embodiments of the invention. For example, probe card assembly 200 may be used in place of probe card 108 in a test system that can include a prober like prober 102 of FIGS. 1A and 1B. For ease of discussion, probe card assembly 200 will be discussed herein as used in prober 102. Probe card assembly 200 may, however, be used in any prober for probing semiconductor wafers or singulated dies or any other system for probing a device to test, monitor, or otherwise operate the device.

Figure 2:
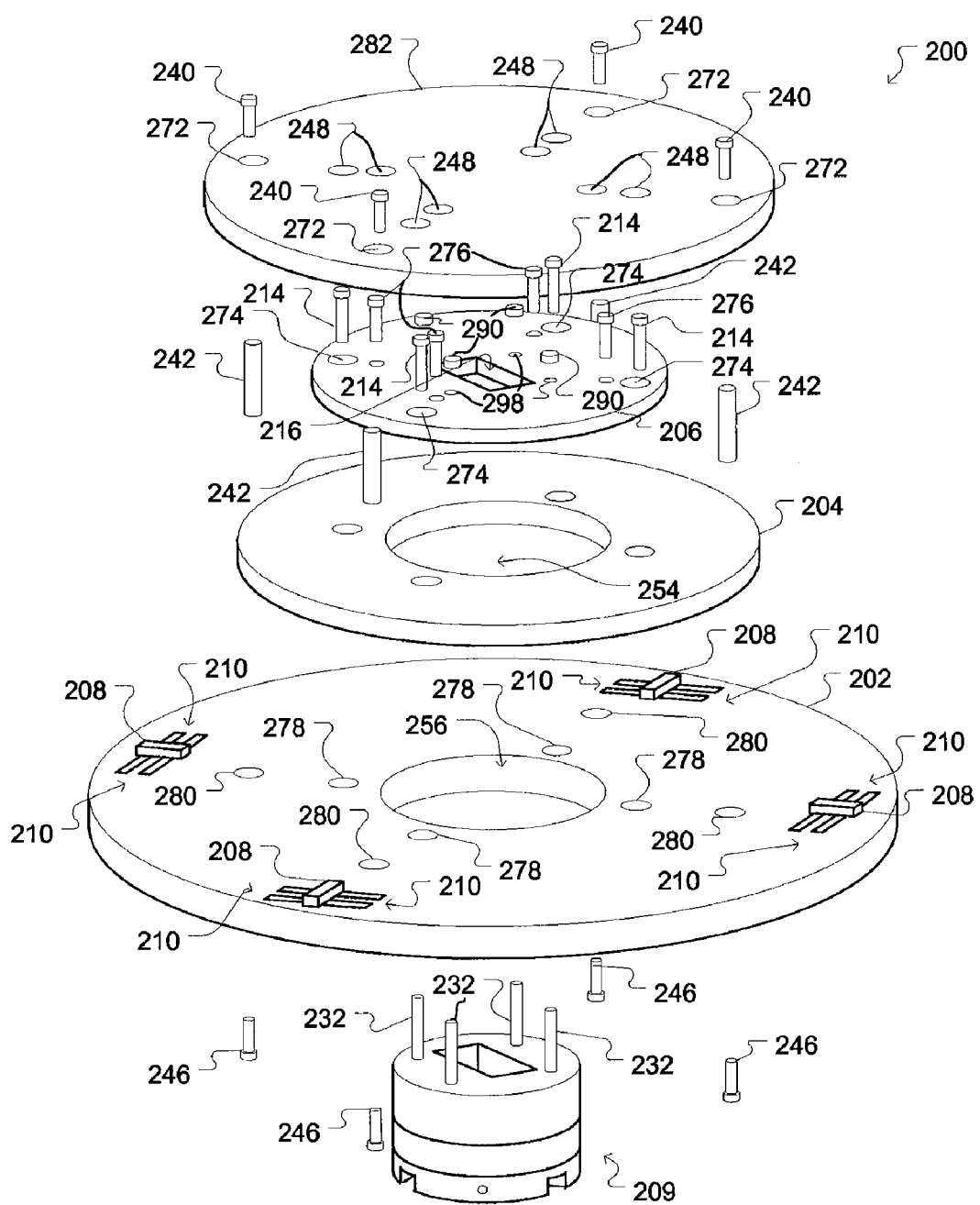
FIG. 2 shows an exploded, perspective view of an exemplary probe card assembly according to some embodiments of the invention.
Figure 3A:
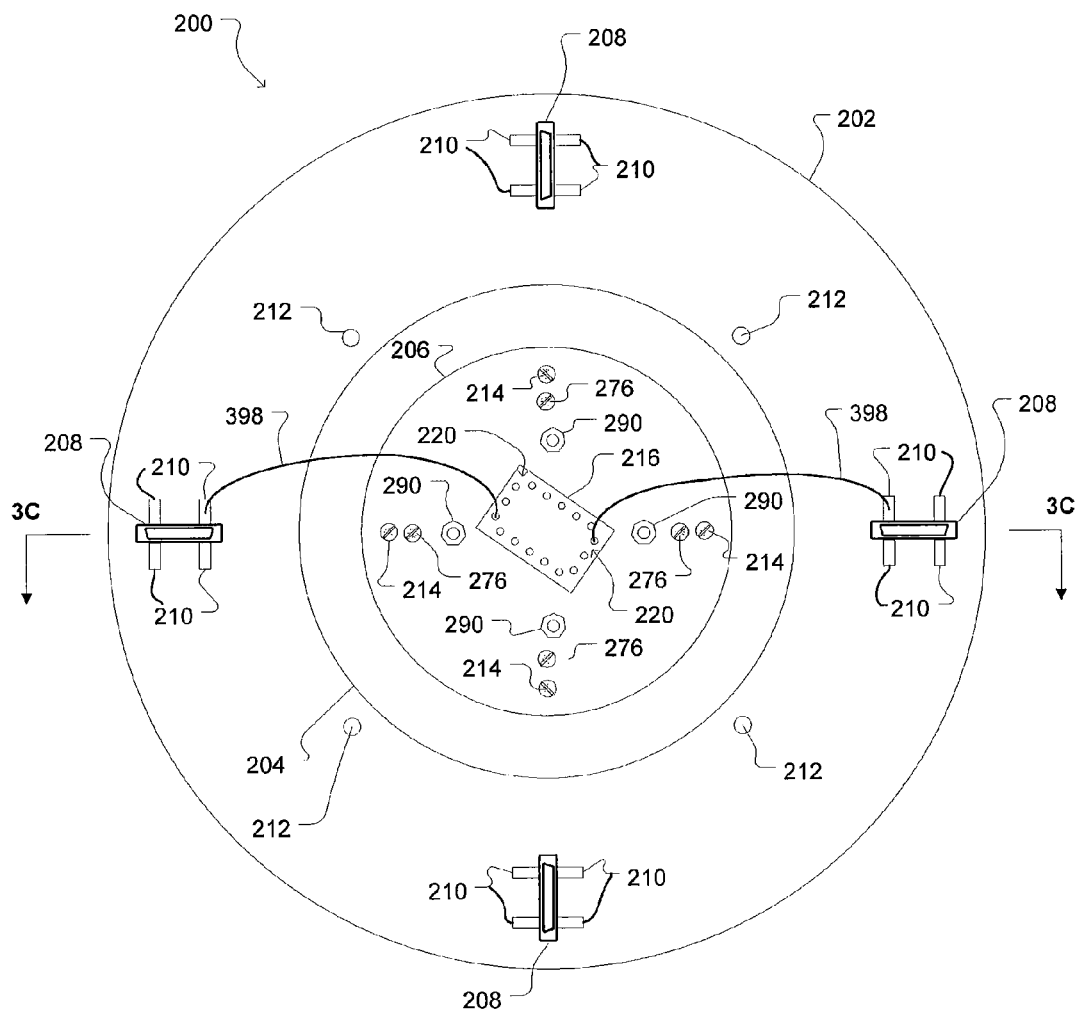
FIG. 3A shows a top view of the probe card assembly of FIG. 2 without the cover.
Figure 3B:
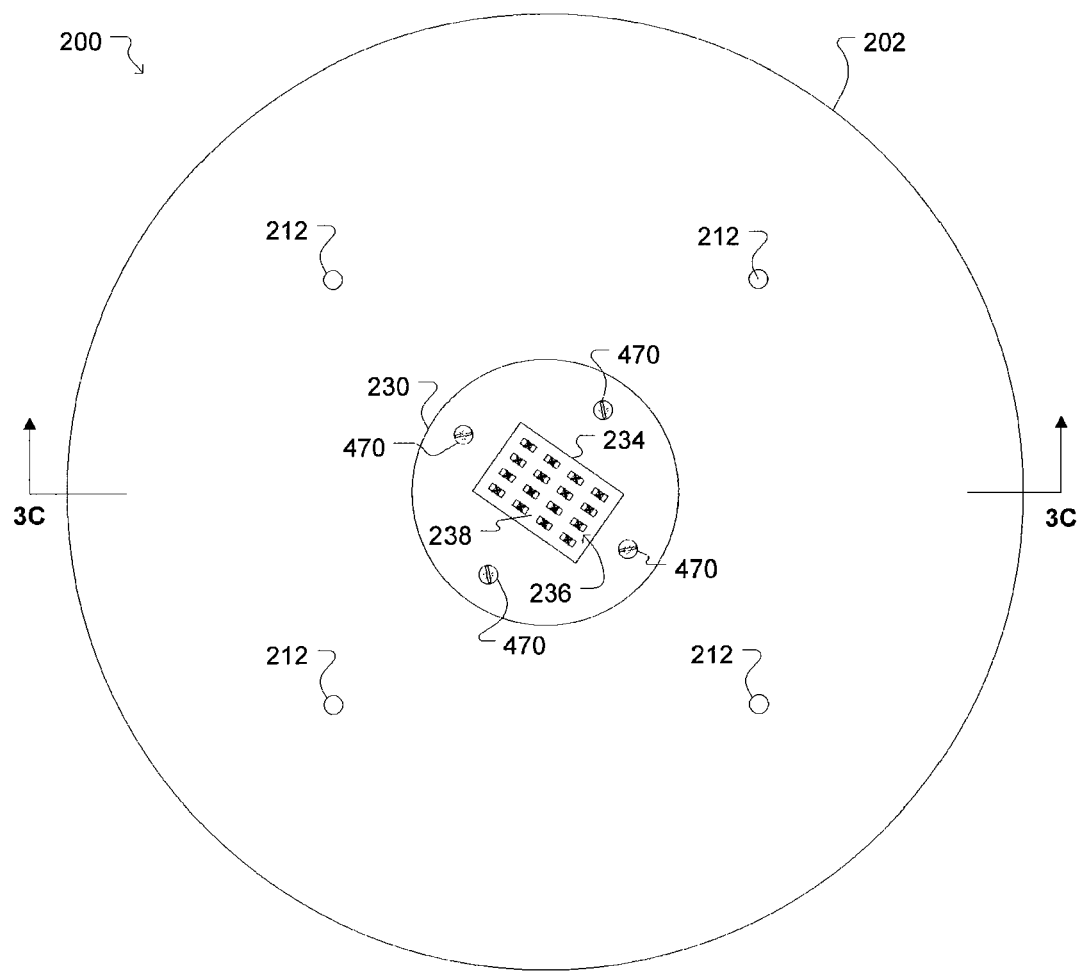
FIG. 3B shows a bottom view of the probe card assembly of FIG. 2.
Figure 3C:
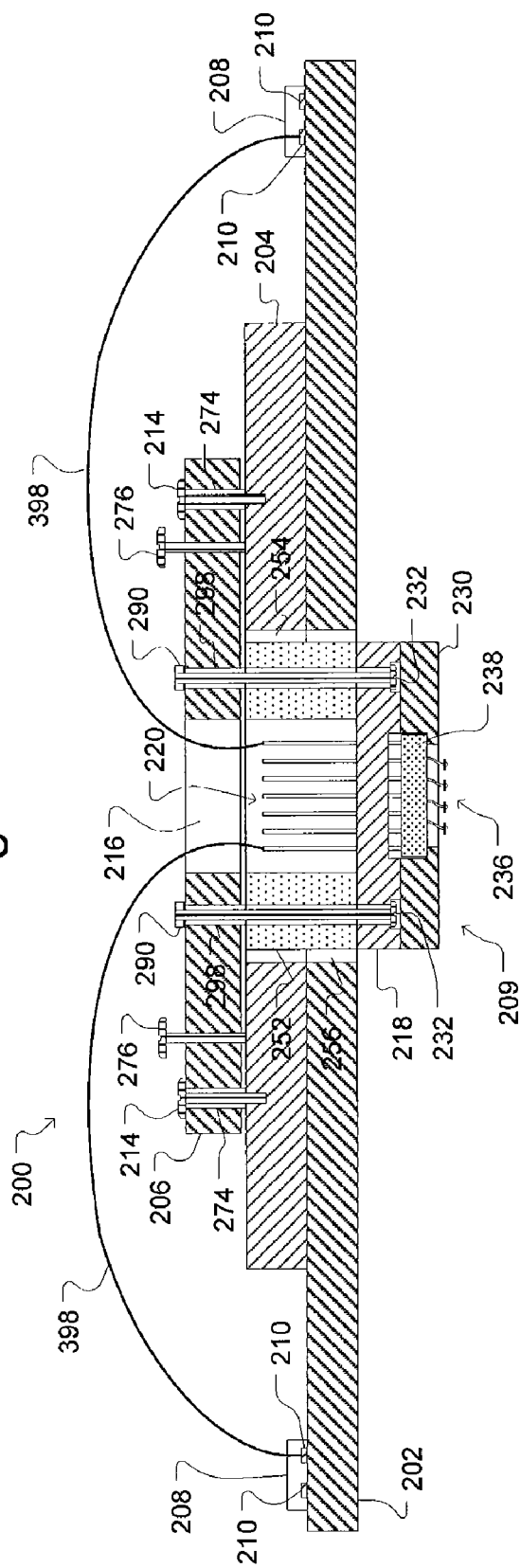
FIG. 3C shows a side, cross-sectional view of the probe card assembly of FIG. 2 without the cover.

FIG. 2 shows an exploded, perspective view of the probe card assembly 200, and FIG. 3A shows a top view, FIG. 3B shows a bottom view, and FIG. 3C shows a side cross-sectional view of probe card assembly 200.

As shown, the probe card assembly 200 can include a wiring substrate 202, a stiffener plate 204, and an adjustment plate 206 to which a probe head assembly 209 can be attached. The probe card assembly 200 may also include a cover 282, which is shown in FIG. 2 but, for purposes of clarity and ease of illustration, is not shown in FIGS. 3A-3C. As shown in FIG. 2, the cover 282 can be fastened to the wiring substrate 202 with screws 240 that pass through holes 272 in cover 282 and thread into spacers 242 and with screws 246 that pass through holes 280 in the wiring substrate 202 and also thread into spacers 242.

Figure 1A:
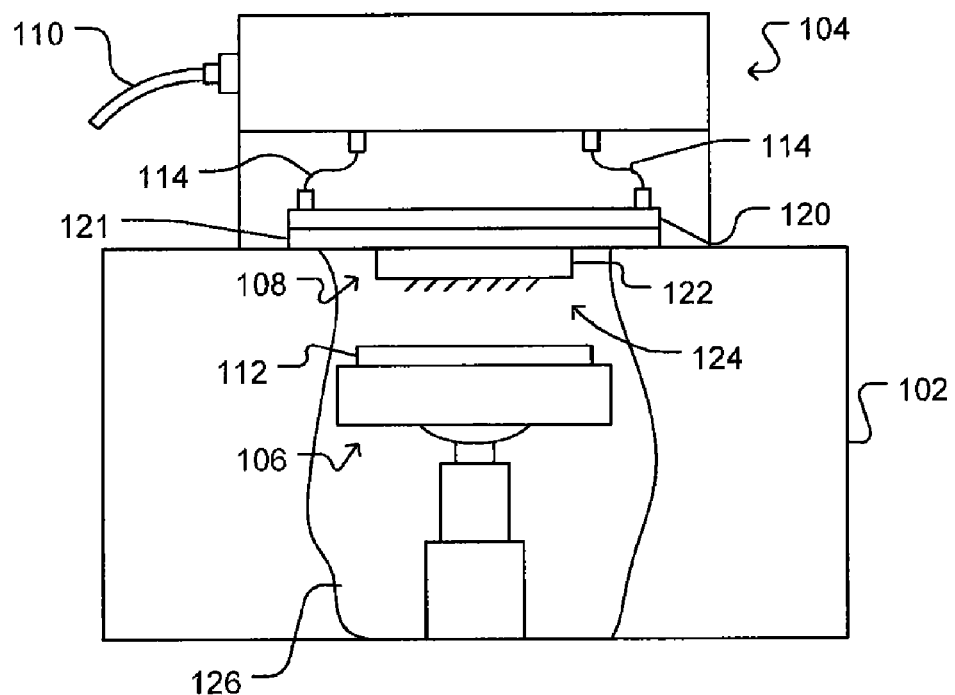
FIGS. 1A and 1B illustrate an exemplary prior art probing system for testing dies of a semiconductor wafer.

As will be seen, one function of the probe card assembly 200 can be to provide an electrical interface between communications channels to and from the tester and the input and/or output terminals (not shown) of a DUT such as 112 in FIG. 1A. (As used herein, the term "DUT" can be one or more dies of an unsingulated semiconductor wafer, one or more semiconductor dies singulated from a wafer (packaged or unpackaged), one or more dies of an array of singulated semiconductor dies disposed in a carrier or other holding device, one or more multi-die electronics modules, one or more printed circuit boards, and/or any other type of electronic device or devices.) As discussed above, the tester (not shown) can be configured to generate test data to be written to the DUT 112 and to receive and evaluate response data generated by the DUT 112 in response to the test data. Wiring substrate 202 can include channel connectors 208 for making electrical connections with the communications channels to and from the tester (not shown). For example, channel connectors 208 may be configured to make electrical connections with the test head 104 of FIGS. 1A and 1B, which in turn can be connected to a tester (not shown) through cable 110. As discussed above, the cable 110 and test head 104 provide communications channels (not shown) to and from the tester (not shown) for test data, response data, power, ground, and/or other electrical signals.

The channel connectors 208 shown in FIGS. 2, 3A and 3C may be zero-insertion-force ("ZIF") connectors that include multiple pin-type connectors (not shown) such that each channel connector 208 connects electrically to multiple tester channels. In the example shown in FIGS. 2 and 3A-3C, each channel connector 208 can be connected to four tester channels (not shown), and each of those four electrical connections can be in turn connected to one of four electrically conductive traces 210. (In other examples, more or fewer than four tester channels can be connected to more or fewer than four traces 210.) As shown in FIGS. 3A and 3C, electrically conductive wires 398 provide electrical connections from the traces 210 to conductive pins 220, which as will be seen, can be electrically connected to probes 236. (Only two wires 398 are shown in FIGS. 3A and 3C for simplicity and ease of illustration. Depending on the application, a sufficient number of wires 398 would typically be used to electrically connect most or all of the traces 210 to most or all of the pins 220.) Opening 216 in the adjustment plate 206 provides access to pins 220.

The use of ZIF connectors 208 is optional, and indeed, any type structure for making electrical connections may be used. For example, channel connectors 208 may be conductive pads or terminals configured to engage electrically conductive pogo pins from the test head 104.

The composition of the wiring substrate 202 is not important and any substrate material may be used. For example, the wiring substrate 202 may be a printed circuit board. In another example, the wiring substrate 202 may comprise a ceramic material, which may provide greater strength and resistance to bending or warping than one or more printed circuit board materials. The wiring substrate 202 may be configured to attach to prober 102. For example, the wiring substrate 202 may be configured to be bolted or clamped to the test head plate 121 of prober 102 (see FIGS. 1A and 1B). As just one example, the wiring substrate 202 may include holes (not shown) along its periphery that correspond to holes 134 of the test head plate 121. Those holes may receive bolts (not shown) that bolt the wiring substrate 202 to the test head plate 121.

Turning now to the stiffener 204, the stiffener can be configured to provide mechanical strength to the probe card assembly 200. For example, such mechanical strength may be utilized to resist bending, warping, or other movement (e.g., horizontal or radial expansion or contraction) of the wiring substrate 202 and/or other parts of the probe card assembly 200 that may be caused by mechanical loads, thermal gradients, etc. Such bending, warping, or other movement may move the probes 236 from their intended positions, which may cause one or more of the probes to press with too much force against the DUT 112, which may damage the probes 236 and/or the DUT 112. Such unwanted movement of the probes 236 may alternatively cause the probes 236 to press against the DUT with too little force to establish good electrical connections or to not contact the DUT 112 at all. The stiffener 204 may be composed of any material or materials that are sturdy and/or provide the needed mechanical strength for a particular application of the probe card assembly 200. For example, the stiffener 204 may be a metal plate.

Thermal gradients across the probe card assembly 200, which may warp or bend the wiring substrate 202 or other parts of the probe card assembly 200, may arise while a DUT 112 is tested at lowered or elevated temperatures. Typically, stage 106 cools or heats the DUT 112 during testing. Such cooling or heating of the DUT 112 can cause thermal gradients across the probe card assembly 200 in which the temperature on the probe-side of the probe card assembly 200 is cooler or hotter than the temperature on the channel-connector (208) side of the probe card assembly 200. The stiffener plate 204 as well as the use of a ceramic wiring substrate 202 are examples of techniques that may be used to counteract the effects of such thermally induced bending or warping.

In the exemplary probe card assembly 200 shown in FIGS. 2 and 3A-3C, the exemplary stiffener 204 can be attached to the wiring substrate 202 and provides mechanical strength directly to the wiring substrate 202. Alternatively, the stiffener 204—rather than the wiring substrate 202—may be configured to be attached to the test head plate 121 of prober 102, in which case the stiffener 204 may be attached directly to the test head plate 121 using any of the means discussed above for attaching the wiring substrate 202 to the test head plate 121. An example of a stiffener 204 configured to be attached to a test head plate 121 of a prober 102 is disclosed and discussed in U.S. Provisional Patent Application No. 60/594,562, which was filed on Apr. 21, 2005.

Turning now to the adjustment plate 206, in the probe card assembly 200 shown in FIGS. 2 and 3A-3C, the wiring substrate 202 and/or stiffener plate 204 as well as the probe head assembly 209 can be attached to the adjustment plate 206, which may be made of any sturdy material. For example, the adjustment plate 206 may be metal, ceramic, etc. If the adjustment plate 206 is made of metal or other materials that resist bending or warping, attaching the probe head assembly 209—and thus the probes 236—directly to the adjustment plate helps keep the probes 236 in position even if mechanical loads or thermal gradients cause bending or warping of the wiring substrate 202 or other parts of the probe card assembly 200, as discussed above. As will be discussed below, the adjustment plate 206 also can allow a planarity or orientation of the probes 236 to be adjusted.

Turning now to the probe head assembly 209, a primary purpose of which can be to hold a probe insert 238 (which is not visible in FIGS. 2 and 3A but is visible in FIGS. 3B and 3C) that has electrically conductive probes 236 for contacting and making electrical connections with input and/or output terminals (not shown) of a DUT 112 (see FIG. 1A), which as discussed above, may be one or more dies of an unsingulated semiconductor wafer, one or more singulated dies (packaged or unpackaged), an electronics module, or any other electronics device or other device to be tested.

As shown in particular in FIGS. 2 and 3C, the probe head assembly 209 can be disposed within an opening 256 in the wiring substrate 202 and a similar opening 254 in the stiffener 204 and attached to the adjustment plate 206 by bolts 232 and nuts 290. As shown, bolts 232 extend from the top of the probe head assembly 209, pass through holes 298 in the adjustment plate 206, and thread into nuts 290. In the exemplary embodiment shown in FIGS. 2 and 3A-3C, the probe head assembly 209 can be attached directly to the adjustment plate 206 rather than the stiffener 204 or wiring substrate 202. As discussed above, attaching the probe head assembly 209 directly to the adjustment plate 206 may provide greater mechanical strength and stability to the probe head assembly 209 than could be achieved if the probe head assembly 209 were attached directly to the wiring substrate 202.

As also shown in particular in FIGS. 2, 3A, and 3C, jacking screws 276 can thread into adjustment plate 206 and abut against stiffener 204. Thus, rotating a jacking screw 276 in one direction can cause jacking screw 276 to advance toward stiffener 204 and push stiffener 204 away from adjustment plate 206. Rotating jacking screw 276 in the opposite direction can retract jacking screw 276 away from stiffener 204, allowing stiffener 206 to move toward adjustment plate 206.

Locking screws 214 pass through holes 274 in adjustment plate 206 and thread into stiffener 204. While locking screws 214 are sufficiently loosened, jacking screws 214 may be advanced toward stiffener 204 or retracted away from stiffener 204 as discussed above. Tightening locking screws 214—that is, threading locking screws 214 into stiffener 204—however, pulls stiffener 204 as close to adjustment plate 206 as jacking screws 276 allow and holds stiffener 204 in that position with respect to adjustment plate 206.

Jacking screws 276 and locking screws 214 thus provide the ability to adjust the planarity or orientation of the adjustment plate 206 with respect to the wiring substrate 204. Holes 248 in cover 282 (See FIG. 2) provide access to the jacking screws 276 and locking screws 214. Although four pairs of jacking screws 276 and locking screws 214 are shown in the probe card assembly 200 (see FIGS. 2 and 3A), fewer or more jacking screws 276 and locking screws 214 may be used.

Figure 1B:
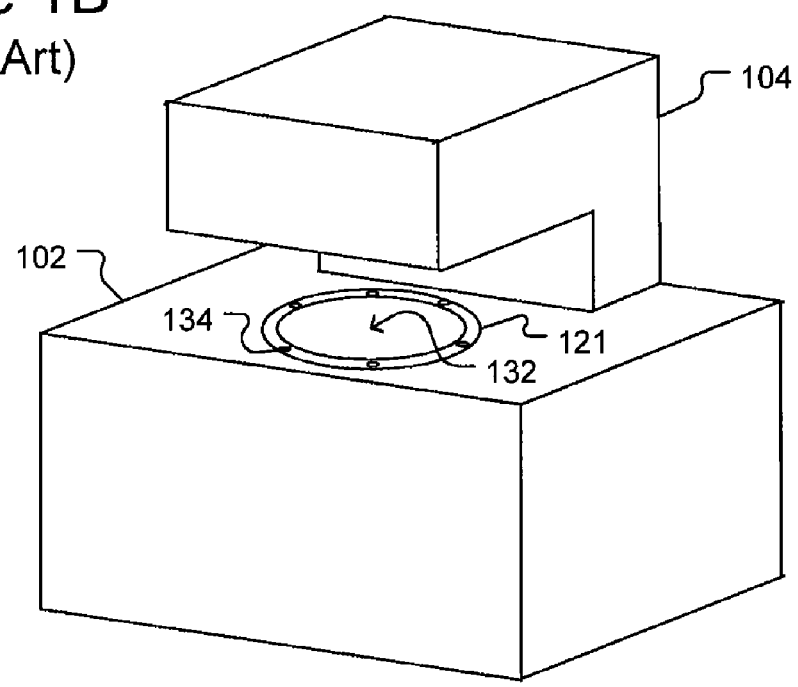
Figure 4:
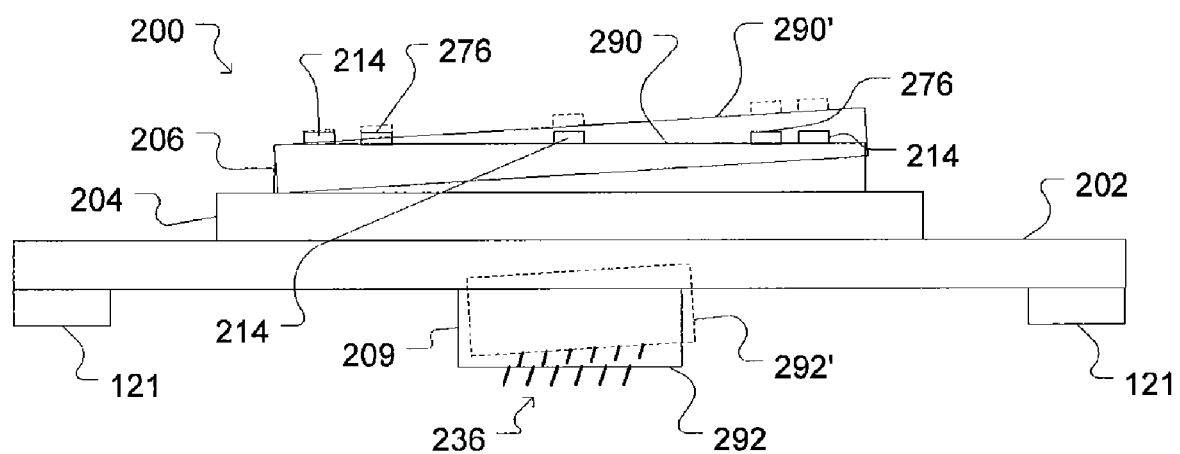
FIG. 4 illustrates exemplary adjustment of a planarity or orientation of the probes of the probe card assembly of FIG. 2.

As shown in FIG. 4 (which shows a simplified block diagram of probe card assembly 200 attached to prober head plate 121 of the prober 102 of FIGS. 1A and 1B), because the probe insert (which is not separately shown in FIG. 4 but, as discussed above, can be part of the probe head assembly 209) with probes 236 is attached to the adjustment plate 206, adjusting the planarity or orientation of the adjustment plate 206 (e.g., from orientation 290 to 290' in FIG. 4) also adjusts the planarity or orientation of the probes 236 (e.g., from orientation 292 to 292' in FIG. 4) with respect to the test head plate 121 of prober 102. Accordingly, the planarity or orientation of the probes 236 may be adjusted to correspond to the planarity or orientation of the DUT (e.g., DUT 112 disposed on stage 106 in FIG. 1A).

Figure 5:
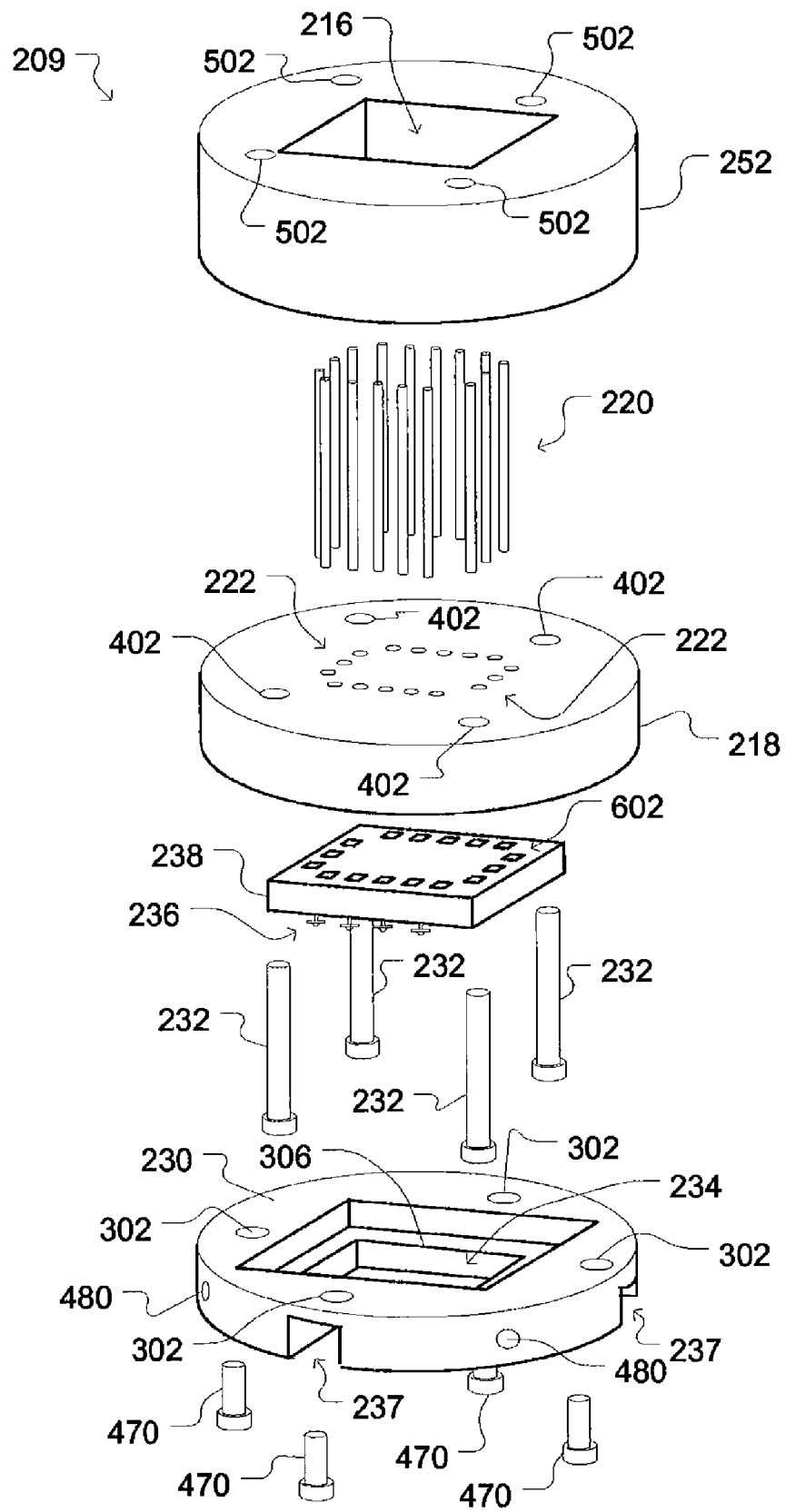
FIG. 5 shows an exploded, perspective view of the probe head assembly of FIG. 2.
Figure 6A:
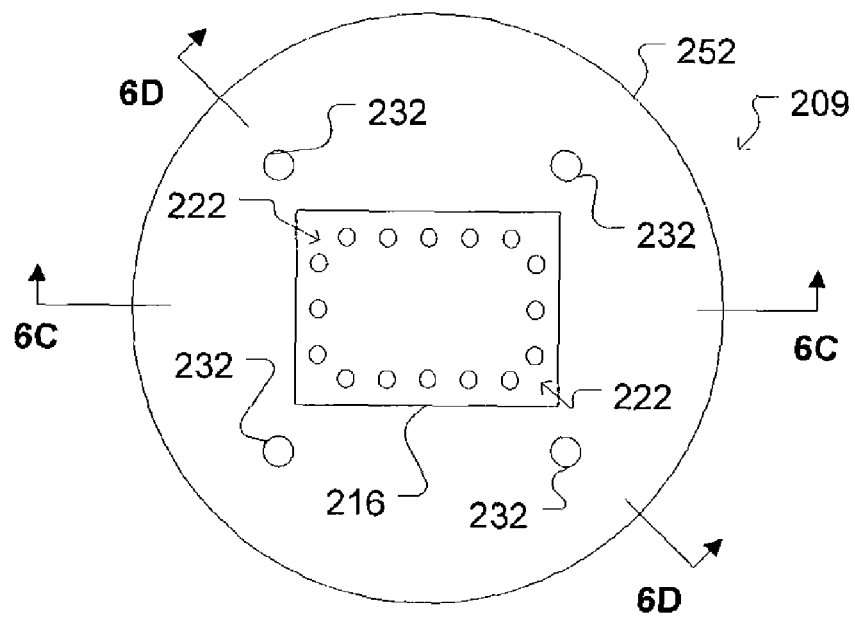
FIG. 6A shows a top view of the probe head assembly of FIG. 5.
Figure 6B:
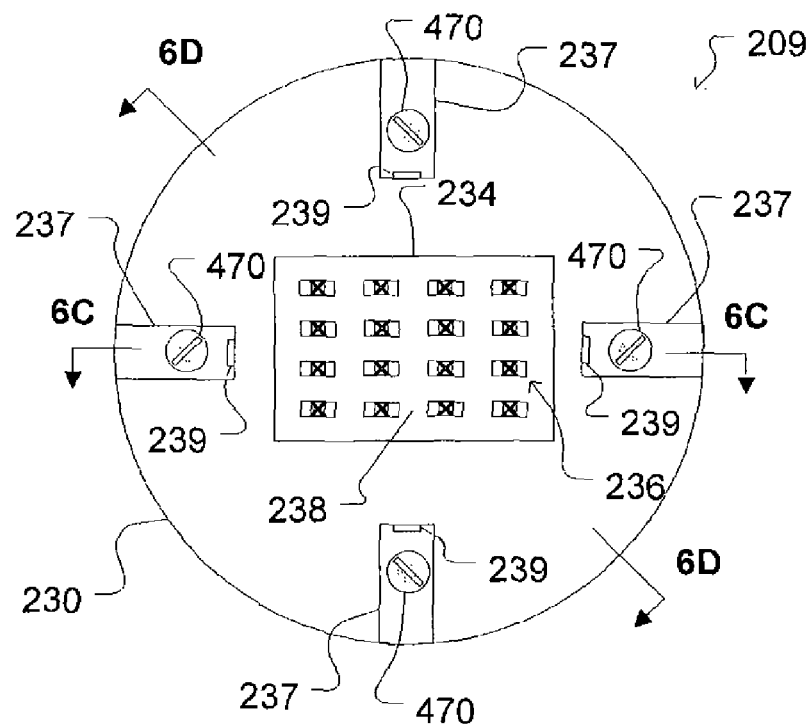
FIG. 6B shows a bottom view of the probe head assembly of FIG. 5.

FIGS. 5 and 6A-6D show details of an exemplary implementation of the probe head assembly 209 according to some embodiments of the invention. (The depiction shown in FIGS. 5 and 6A-6D may not necessarily be to scale.) FIG. 5 shows an exploded, perspective view, FIG. 6A shows a top view, FIG. 6B shows a bottom view, and FIGS. 6C and 6D show side, cross-sectional views of probe head assembly 209. As shown in those Figures, the probe head assembly 209 can include an insert holder 230 that holds a probe insert 238 with probes 236 for contacting the input and/or output terminals (including power and ground terminals) of the DUT 112, a pin holder 218, and a spacer 252.

The insert holder 230 can include a graduated opening 234 with ledges 306. The probe insert 238 can fit into a top of opening 234 and rest on ledges 306, and the probes 236 attached to the insert 238 can extend through a bottom of opening 234, as shown most clearly in FIGS. 6C and 6D. Insert holder 230 can also include recesses 237, which as shown in FIGS. 6B and 6C, provide access to set screws 239. As shown in FIG. 6C, set screws 239 thread through the insert holder 230 into the opening 234 and against the probe insert 238. Rotating set screws 239 in one direction tightens screws 239 against probe insert 238, which holds probe insert 238 in place within insert holder 230. Rotating screws 239 in the other direction loosens screws 239, allowing probe insert 238 to be removed from insert holder 230. Additional openings (not shown) may be included around the periphery of opening 234 to facilitate removal of a probe insert 238 from opening 234. Insert holder 230 may be formed of any suitable material, including without limitation metal, ceramic, etc.

Probe insert 238 can include probes 236 attached to one side. Insert 238 can also include electrically conductive pads 602 disposed on the opposite side from the probes 236. Electrical connections (not shown) connect ones of the pads 602 with ones of the probes 236. The insert 238 may comprise any suitable material, including without limitation ceramic, printed circuit board material, etc.

Probes 236 may be resilient, conductive structures. Non-limiting examples of suitable probes 236 include composite structures formed of a core wire bonded to a conductive terminal (not shown) on probe insert 238 that can be over coated with a resilient material as described in U.S. Pat. Nos. 5,476,211, 5,917,707, and 6,336,269. Probes 236 may alternatively be lithographically formed structures, such as the spring elements disclosed in U.S. Pat. Nos. 5,994,152, 6,033,935, 6,255,126, 2001/0044225, and 2001/0012739. Other nonlimiting examples of probes 236 include conductive pogo pins, bumps, studs, stamped springs, needles, buckling beams, etc.

Pin holder 218 provides through holes 222 for a plurality of electrically conductive pins 220. The pins 220 pass through holes 222 and make electrical connections with pads 602 on probe insert 238. Pins 220 may be spring loaded to provide spring forces against the pads 602 and thereby maintain electrical connections with the pads 602. For example, pins 220 may be pogo pins configured with a spring bias away from the pin holder 218 and toward the probe insert 238. Pin holder 218 may comprise any suitable material, including without limitation metal, ceramic, printed circuit board material, etc. If pin holder 218 comprises an electrically conductive material, holes 222 can include an electrically insulating material.

Spacer 252 can include an opening 216 into which pins 220 extend. Spacer 252 may comprise any suitable material, including without limitation metal, ceramic, printed circuit board material, etc.

As shown in FIG. 6D, bolts 232 extend through holes 402 and 502 in the pin holder 218 and spacer 252, respectively, and out of the top of the probe head assembly 209. As shown in FIG. 3C, the portions of bolts 232 that extend out of the top of the probe head assembly 209 pass through holes 298 in the adjustment plate and thread into corresponding nuts 290, thus attaching the pin holder 218 and spacer 252 to the adjustment plate 206. Referring again to FIG. 6C, bolts 470 pass through holes 302 in the insert holder 230 and thread into the pin holder 218, thus attaching the insert holder 230 to the pin holder 218 and thus also to the spacer 252 and adjustment plate 206. As also shown, counter-sink holes 460 in pin holder 218 accommodate the heads of bolts 232, allowing insert holder 230 to be attached flush against the pin holder 218.

The insert 238 of probe card assembly 200 can be removed from probe card assembly 200 by simply removing bolts 470, the removal of which detaches the insert holder 230 from the pin holder 218 and thus from the probe card assembly 200. Once the insert holder 230 is removed, the probe insert 238 may be removed from the insert holder 230 and replaced with a new insert 238'. Thereafter, the insert holder 230 can be reattached to the probe card assembly 200 by passing bolts 470 through holes 302 in the insert holder 230 and threading bolts 470 into the pin holder 218. Alternatively, a new insert holder 230' with a new insert 238' may be attached to pin holder 218 using bolts 470.

Other attachment mechanisms may be used in place of bolts 470. For example, screws, clamps, mechanical locking devices, etc. may be used in place of bolts 470 to secure the insert holder 230 to the pin holder 218. Moreover, insert holder 230 and probe insert 238 need not be separate and distinct structural entities. For example, insert holder 230 may be solid and thus lack opening 234. Terminals 602 may be disposed on one side of insert holder 230 and probes 236 disposed on the other side with electrical connections between terminals 602 and probes 236 through insert holder 230. In such a case, probe sets can be changed by changing insert holders 230 rather than changing probe inserts.

Figure 7:
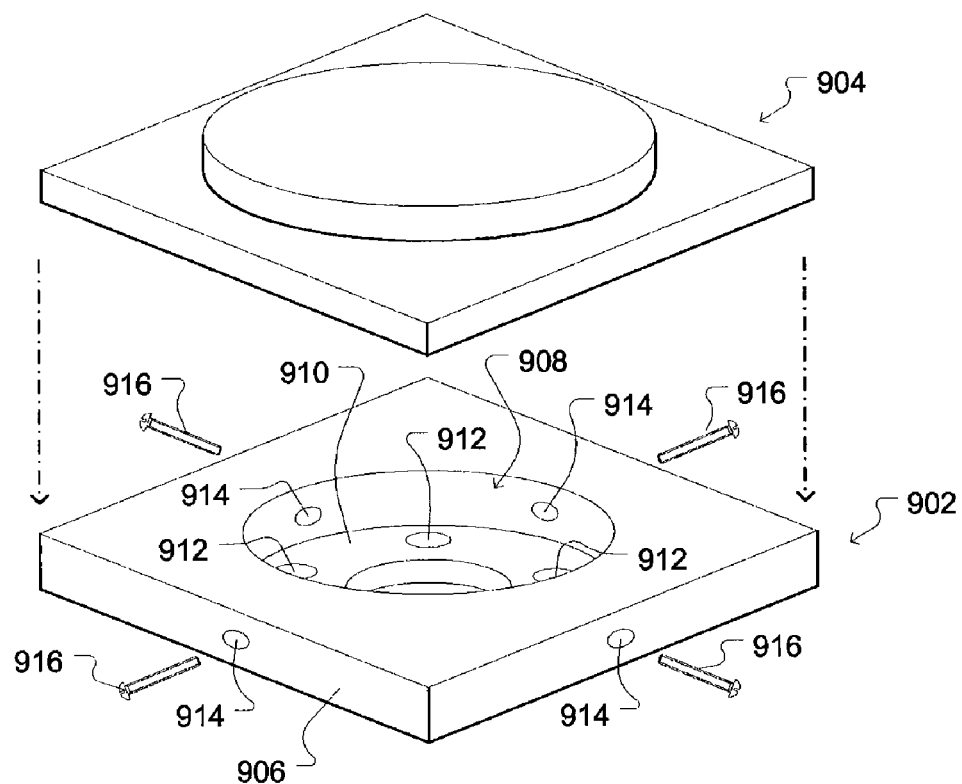
FIG. 7 shows an exploded, perspective view of an attachment tool with a cover but without an insert holder according to some embodiments of the invention.
Figure 8A:
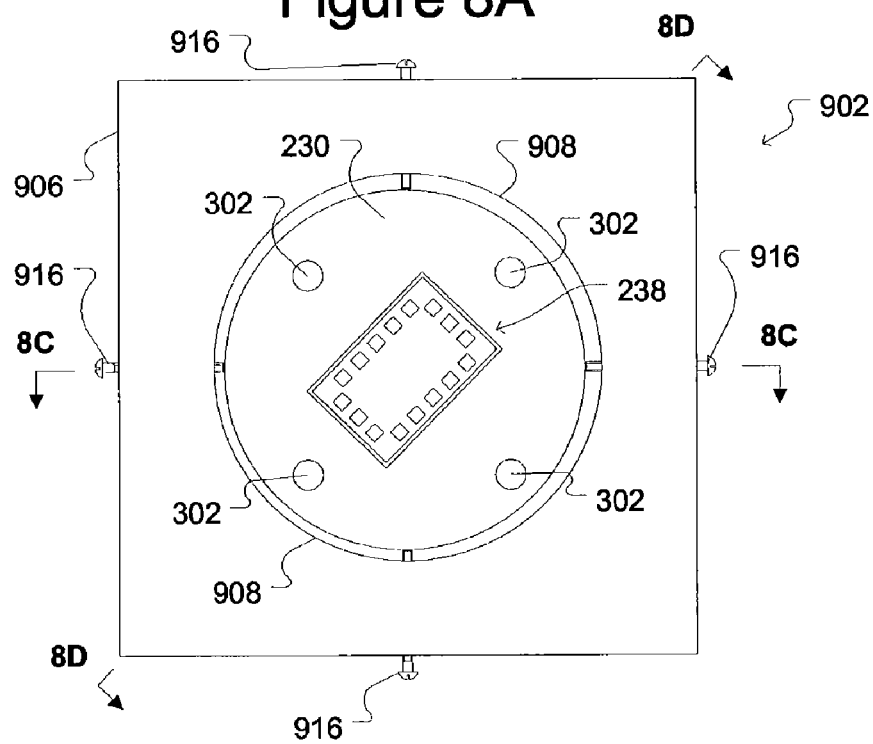
FIG. 8A shows a top view of the attachment tool of FIG. 7 with an insert holder but without the cover.
Figure 8B:
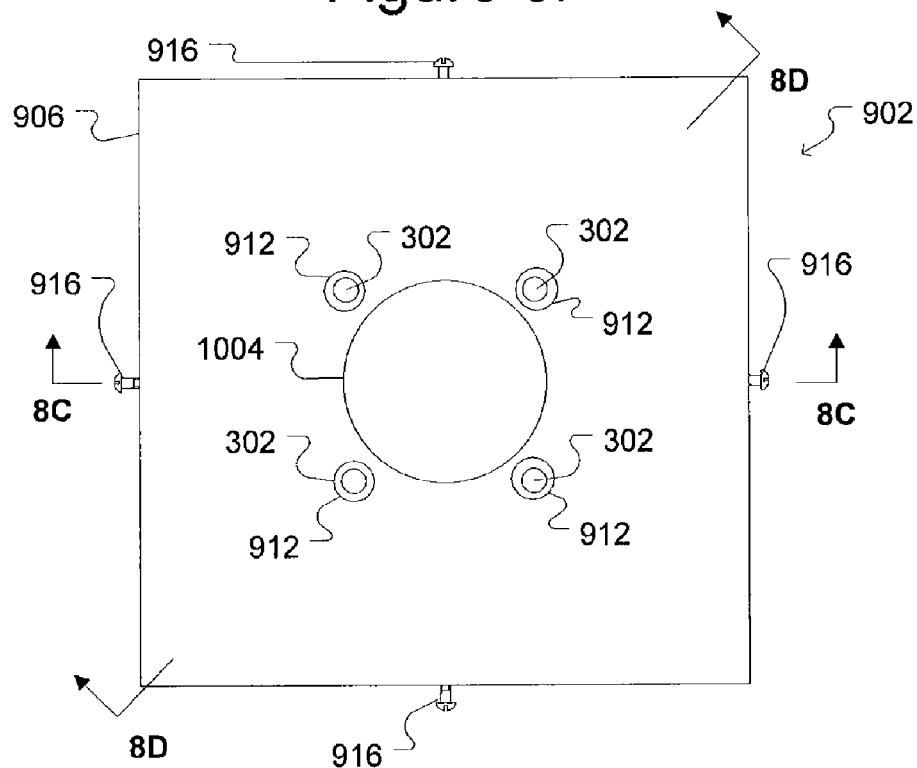
FIG. 8B shows a bottom view of the attachment tool of FIGS. 8A and 8B.
Figure 8C:
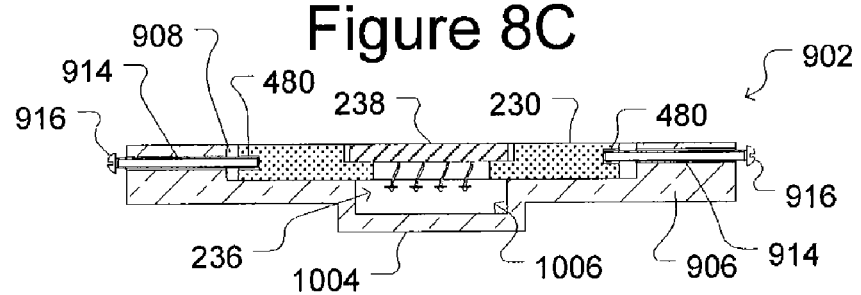
FIGS. 8C and 8D show side, cross-sectional views of the attachment tool of FIG. 8A.
Figure 8D:
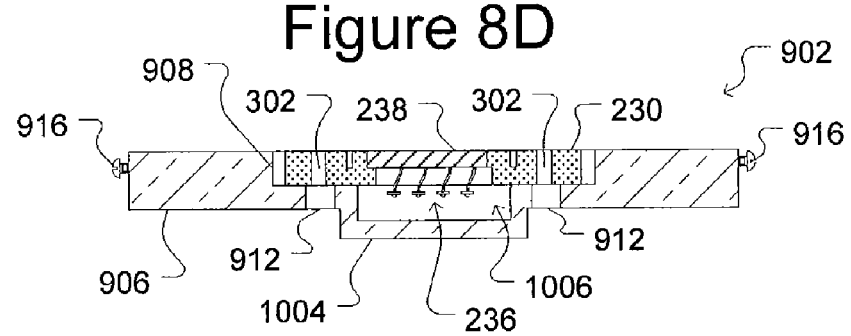

FIGS. 7 and 8A-8D illustrate an exemplary attachment tool 902 that facilitates attaching and detaching insert holder 230 to and from the probe card assembly 200 according to some embodiments of the invention. FIG. 7 shows an exploded, perspective view of the attachment tool 902 with an optional cover 904, and FIG. 8A shows a top view, FIG. 8B shows a bottom view, and FIGS. 8C and 8D show side, cross-sectional views of the attachment tool 902 (without the cover 904).

As shown, the attachment tool 902 can comprise a substrate 906 that has a well 908. As shown in FIGS. 8A-8D, the well 908 can be sized to receive an insert holder, like insert holder 230. As best seen in FIGS. 7 and 8C, set screws 916 thread into threaded holes 914 in the substrate 906 and into threaded holes 480 in the insert holder 230. Advancing set screws 916 through hole 914 and into hole 480 holds the insert holder 230 securely in well 908. Loosening set screws 916 such that the screws 916 retract from holes 480, releases the insert holder 230, allowing the insert holder 230 to be removed from well 908. The well 908 can include extension 1004 that provides space 1006 for the probes 236 attached to the insert 238. Holes 912 in the substrate 906 align with holes 302 in the insert holder 230 and provide openings for a screw driver (not shown) or other tool for accessing screws 470, which as discussed above, attach the insert holder 230 to the pin holder 218. Removable cover 904 may be screwed (not shown), bolted (not shown), clamped (not shown), or otherwise removably attached to the substrate 906.

Figure 9C:
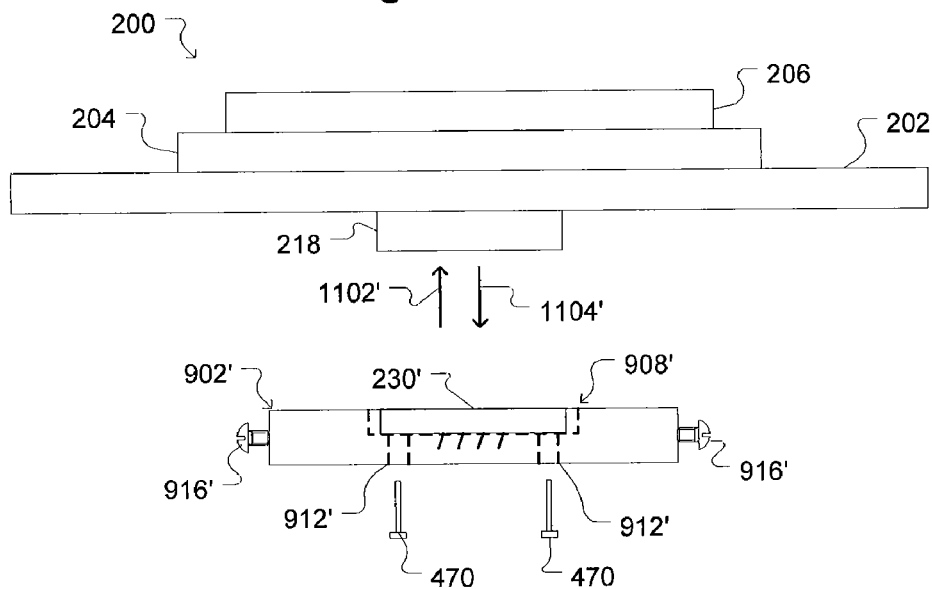

FIGS. 9A, 9B, and 9C illustrate an exemplary process for changing insert 238 on probe card assembly 200, which is shown in simplified block format. As shown in FIG. 9A, adjustment plate 206, stiffener 204, wiring substrate 202, and probe head assembly 209, although depicted in block format, can be as discussed above and can be assembled as discussed above. As also discussed above, screws 470 attach the insert holder 230 to the pin holder 218 (which can be attached to the spacer 252 (not shown in FIG. 9A) and the adjustment plate 206 by bolts 232 and nuts 290 (not shown in FIG. 9A) as discussed above. Although not shown in FIG. 9A, an insert 238 can be disposed in insert holder 230 as generally discussed above.

As shown in FIG. 9B, insert holder 230 may be removed from pin holder 218 by moving 1102 attachment tool 902 (which is also shown in simplified block format in FIG. 9B but can include the features described above with respect to FIGS. 7 and 8A-8D) such that the insert holder 230 can be disposed in the well 908 of the attachment tool 902. Set screws 916 can then be tightened as discussed above to secure the insert holder 230 in the well 908. A tool such as a screw driver (not shown) can then be inserted through holes 912 in attachment tool 902 to engage screws 470, which can then be loosened and removed, which detaches the insert holder 230 from pin holder 218. The attachment tool 902, now with insert holder 230 in its well 908, can be moved 1104 away from the probe card assembly 200. Cover 904 may then be placed on the attachment tool 902 to protect the probe insert 238, and the probe insert 238 may thus be safely stored or transported to a repair facility.

As shown in FIG. 9C, a replacement insert holder 230' that holds a replacement insert 238' (not shown) may be attached to the probe card assembly 200 in similar fashion. That is, another attachment tool 902' in whose well 908' is secured the replacement insert holder 230', can be moved 1102' into engagement with the pin holder 218 and holes 302 (not shown in FIG. 9C) in the insert holder 230' can be aligned with corresponding threaded holes (not shown) in the pin holder 218. A tool such as a screw driver (not shown) can then be inserted through holes 912' in attachment tool 902' to drive screws 470 through holes 302 in the new insert holder 230' and thread screws 470 into the pin holder 218 (as shown in FIG. 6C), attaching the new insert holder 230' to the pin holder 218. Once screws 470 are tightened, set screws 916 can be loosened, releasing the insert holder 230', and the attachment tool 902' can be moved 1104' away from the insert holder 230', which can now be attached to the pin holder 218.

As discussed above inert holder 230 and probe insert 238 may be modified to comprise a single entity rather than being separate structural entities.

Figure 10:
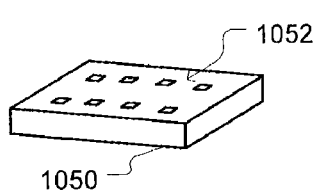
FIG. 10 illustrates an exemplary DUT in the form of a semiconductor die.

FIGS. 10, 11, 12A, 12B, 13, 14A, 14B, and 15 illustrate exemplary application of the foregoing process of changing the probe insert 238 of probe card assembly 200 according to some embodiments of the invention. FIG. 10 illustrates a semiconductor die 1050, which can be an exemplary DUT to be tested using probe card assembly 200. (Other examples of a DUT include, without limitation, a packaged die, a test structure or other feature on a semiconductor wafer, etc.) As shown, die 1050 can include eight input and/or output terminals 1052 for receiving input signals, power, and ground into the die 1050, and for outputting signals from the die 1050. As also shown, the terminals 1052 can be arranged on the die 1050 in two rows with four terminals 1052 in each row.

Figure 11:
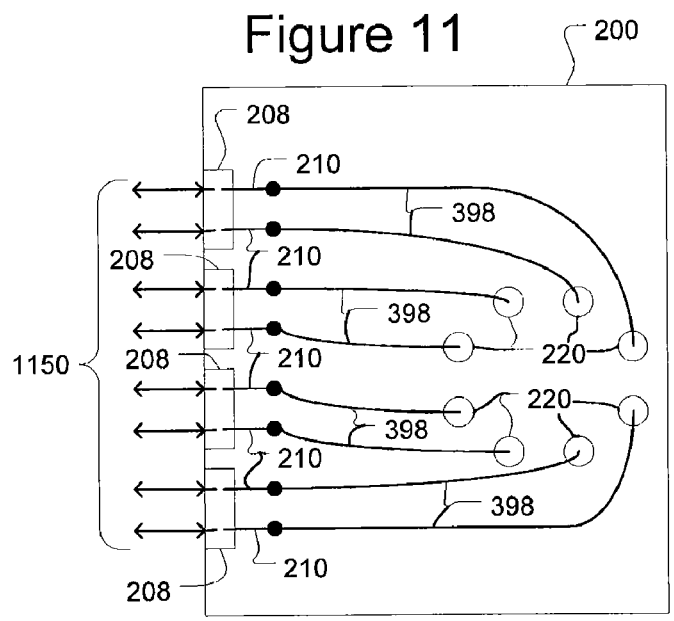
FIG. 11 illustrates in schematic format an exemplary configuration of the probe card assembly of FIG. 2 for testing the DUT of FIG. 10 according to some embodiments of the invention.
Figure 12A:
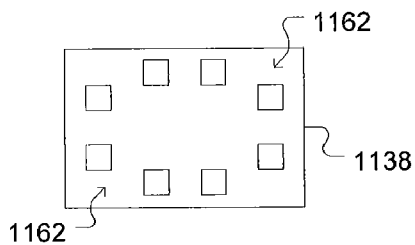
FIG. 12A illustrates a top view of a probe insert configured for testing the DUT of FIG. 10 according to some embodiments of the invention.
Figure 12B:
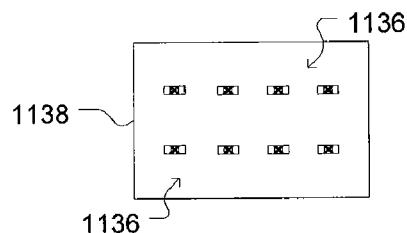
FIG. 12B illustrates a bottom view of the probe insert of FIG. 12A.

FIG. 11 illustrates in simplified schematic format, a configuration of probe card assembly 200 for testing die 1050, and FIGS. 12A and 12B illustrate a probe insert 1138 for testing die 1050.

In FIG. 11, four channel connectors 208 of probe card assembly 200 can be connected to eight tester channels 1150, which as discussed above, can be for providing test data, power, and ground from the tester (not shown) to die 1050 and providing response data generated by the die 1050 in response to the test data to the tester (not shown). As also discussed above, connections to the tester channels 1050 can be provided through the connectors 208 to traces 210, and wires 398 electrically connect traces 210 to conductive pins 220.

Probe insert 1138, like probe insert 238, can be designed to be placed in insert holder 230 and, while insert holder 230 is bolted 470 to pin holder 218, pads 1162 are pressed against and make electrical connections with pins 220 as discussed above with respect to FIG. 2. (FIG. 12A shows a top view of insert 1138, and pads 1162 may be generally similar to pads 602 of FIG. 5.) The pads 1162 can be electrically connected to probes 1136, which as shown in FIG. 12B (which shows a bottom view of insert 138) can be arranged in a layout that corresponds to the terminals 1052 of die 1050. That is, probes 1136 can be positioned and configured to correspond to and contact terminals 1052 of die 1050. Thus, configured, probe card assembly 200 can be configured to provide an electrical interface between tester channels 1150 and the terminals 1052 of die 1050. That is, connectors 208, traces 210, wires 398, pins 220, pads 1162, and probes 1136 provide electrical paths between tester channels 1150 and die 1050 pads 1052. Of course, wires 398 associate corresponding traces 210 and pins 220 so that a tester channel 1150 to which a particular signal is assigned can be connected to the terminal 1052 of die 1050 that corresponds to that signal. For example, the channel 1150 that delivers power must be connected to a probe 236 that is positioned to contact the power terminal 1052 of die 1050. As another example, the channel 1150 that delivers a particular control signal (e.g., a write enable signal) must be connected to a probe 236 that contacts the terminal 1052 of die 1050 that is designed to receive that control signal (e.g., the write enable terminal 1052 of die 1050).

Figure 13:
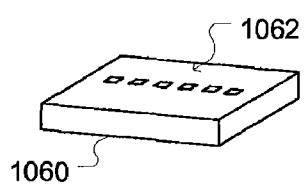
FIG. 13 illustrates another exemplary DUT in the form of a semiconductor die.
Figure 14A:
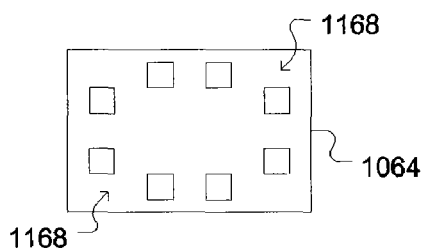
FIG. 14A illustrates a top view of a probe insert configured for testing the DUT of FIG. 13 according to some embodiments of the invention.
Figure 14B:
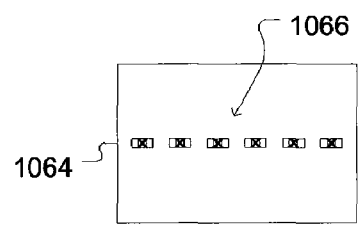
FIG. 14B illustrates a bottom view of the probe insert of FIG. 14A.

FIG. 13 illustrates another die 1060 that is to be tested and thus represents a second DUT with a second pattern of terminals to be contacted. As shown in FIG. 13, die 1060 can include six input and/or output terminals 1062 arranged in a single row. FIG. 14B shows a bottom view of a probe insert 1064 having six probes 1066 arranged in a single row to correspond to and contact pads 1062 of die 1060. The top side of insert 1064, which is shown in FIG. 14A, can be configured the same as insert 1138. That is, insert 1064 can include eight pads 1168 arranged so that, while insert 1064 is in insert holder 230 and insert holder 230 can be attached by bolts 470 to pin holder 218, pads 1168 are pressed against and make electrical connections with pins 220. Because insert 1064 can include only six probes 1066, only six of the eight pads 1168 are connected to probes 1066 and the other two pads 1168 are not used.

Figure 15:
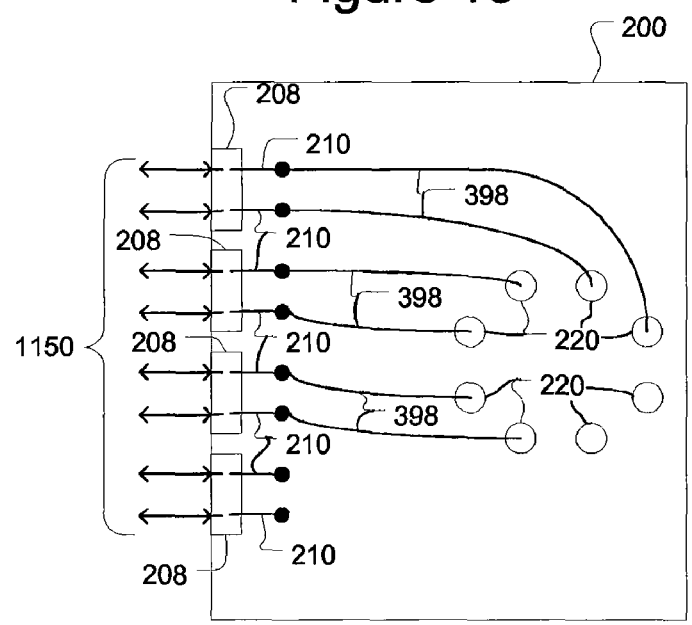
FIG. 15 illustrates in schematic format an exemplary reconfiguration of the probe card assembly of FIG. 2 for testing the DUT of FIG. 13 according to some embodiments of the invention.

The probe card assembly 200, configured as discussed above with respect to FIGS. 11, 12A, and 12B to contact die 1050 may be easily reconfigured to contact die 1060 by simply replacing insert 1138 with insert 1064 as discussed above with respect to 9A-9C. To the extended necessary, wiring 398 may also be reconfigured. For example, as shown in FIG. 15, because die 1060 has only six terminals 1062, only six of the eight tester channels 1150 are needed to test die 1060. Wires 398 may thus be reconfigured to connect only six tester channels 1150 to only six pins 220 that correspond to the six pads 1162 on insert 1064 that are connected to the six probes 1066 of insert 1064. As discussed above, the wires 398 connect tester channels 1050 with probes 236 to match channel 1050 signals with terminal 1062 signals.

It should be apparent that most of the probe card assembly 200 can be used to test both die 1050 and die 1060 despite that fact that the configuration, layout, position, and signal assignments of the terminals 1052 of die 1050 are different than for the terminals 1062 of die 1060. Indeed, the wiring substrate 202, stiffener 204, adjustment plate 206, cover 282, and all of the probe head assembly except the probe insert 238 may be used to test both dies 1050, 1060. Only the probe insert 238 and the wires 398 need be changed. Of course, the ability to reuse most of the probe card assembly 200 in testing dies of different configurations may provide cost and time savings as compared to redesigning and manufacturing a completely new probe card assembly for each new die configuration to be tested.

The examples shown in FIGS. 10-14B are exemplary only. Many variations are possible. For example, the number and layout of terminals on a die and the number and layout of tester channels is exemplary only and provided for purposes of example and ease of discussion. Moreover, the depictions in FIGS. 10-14B may not be to scale.

The ease with which a probe insert 238 may be changed in probe card assembly 200 also facilitates repair of the probe card assembly 200. Failure of one or more probes 236 can be a problem that gives rise to the need to repair a probe card assembly. If a probe 236 of probe card assembly 200 fails (e.g., breaks), the probe insert 238 may be removed and replaced with a new probe insert 238. The removed probe insert 238 with the broken probe 236 may then be taken to a repair facility where the probe is fixed or replaced. In the mean time, however, the probe card assembly 200—now with the new probe insert 238—may continue to be used to test DUTs. There is no need to transport the entire probe card assembly 200 to the repair facility and thus take the probe card assembly 200 out of use during the time required to repair the probe 236.

FIGS. 16A, 16B, 17A, 17B, and 18-20 illustrate other exemplary probe card assemblies having probe inserts that can be removed and replaced according to some embodiments of the invention.

Figure 16A:
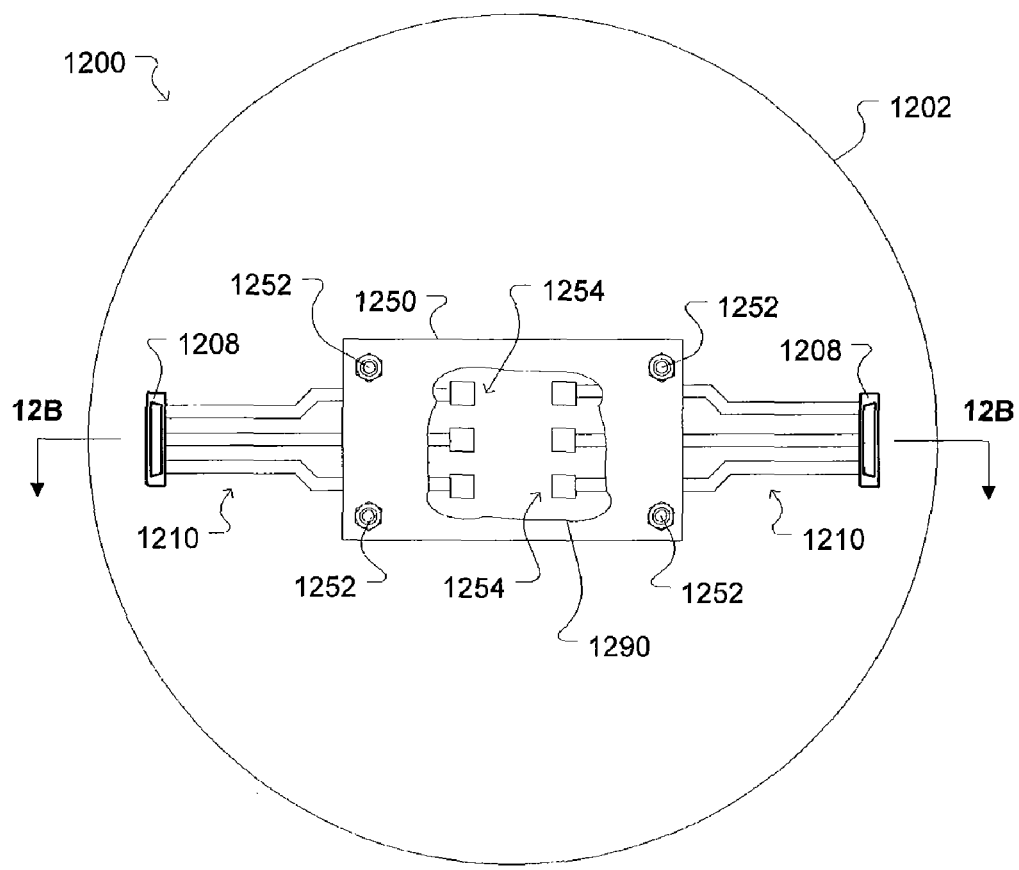
FIG. 16A illustrates a top view of another exemplary probe card assembly according to some embodiments of the invention.
Figure 16B:
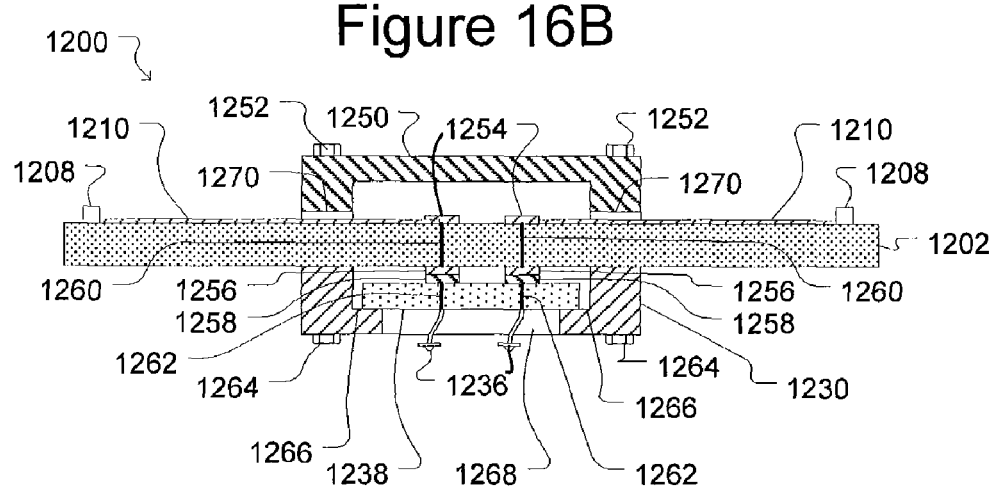
FIG. 16B illustrates a side, cross-sectional view of the probe card assembly of FIG. 16A.

FIGS. 16A and 16B illustrate another exemplary probe card assembly 1200 according to some embodiments of the invention. FIG. 16A illustrates a top view with a cutout 1290 in cover 1250. Cutout 1290 reveals pads 1254. FIG. 16B illustrates a side-cross-sectional view of probe card assembly 1200.

As shown, probe card assembly 1200 can include a wiring substrate 1202 with channel connectors 1208 and an insert 1238 with probes 1236, all of which may be generally similar to like named elements of probe card assembly 200. In the probe card assembly 1200, electrically conductive traces 1210, which pass through passages 1270 in cover 1250 as shown in FIG. 16B, provide electrical connections for data signals, control signals, and other input and/or output (e.g., power and ground) from the channel connectors 1208 to electrically conductive pads 1254 disposed on an upper surface of the wiring substrate 1202. Electrically conductive vias 1260 electrically connect pads 1254 with pads 1256 disposed on a lower surface of the wiring substrate 1202.

Insert 1238 can be disposed on ledges 1266 of an insert holder 1230. Bolt 1264 passes through holes (not shown) in insert holder 1230, wiring substrate 1202, and cover 1250 to engage nuts 1252. While the insert holder 1230 is bolted to the wiring substrate 1202 by bolts 1264 and nuts 1252 as shown in FIG. 16B, electrically conductive pads 1258 on the insert 1238 are held against, and thus engage, pads 1256 and thereby form electrical connections with the pads 1256 on the lower surface of the wiring substrate 1202. The pads 1258 on the insert 1238 can be electrically connected to the probes 1236 by electrically conductive vias 1262 as shown in FIG. 16B.

Insert 1238 can be replaced by loosening bolts 1264 and detaching the insert holder 1230 from the wiring substrate 1202. Once the insert holder 1230 is detached from the wiring substrate 1202, the insert 1238 may be removed from the insert holder 1230 and replaced with a new insert 1238'. The insert holder 1230 may then be reattached to the wiring substrate 1202 with bolts 1264, connecting the new insert 1238' to the pads 1256 on the lower surface of the wiring substrate 1202 and thus also to channel connectors 1208.

Figure 17A:
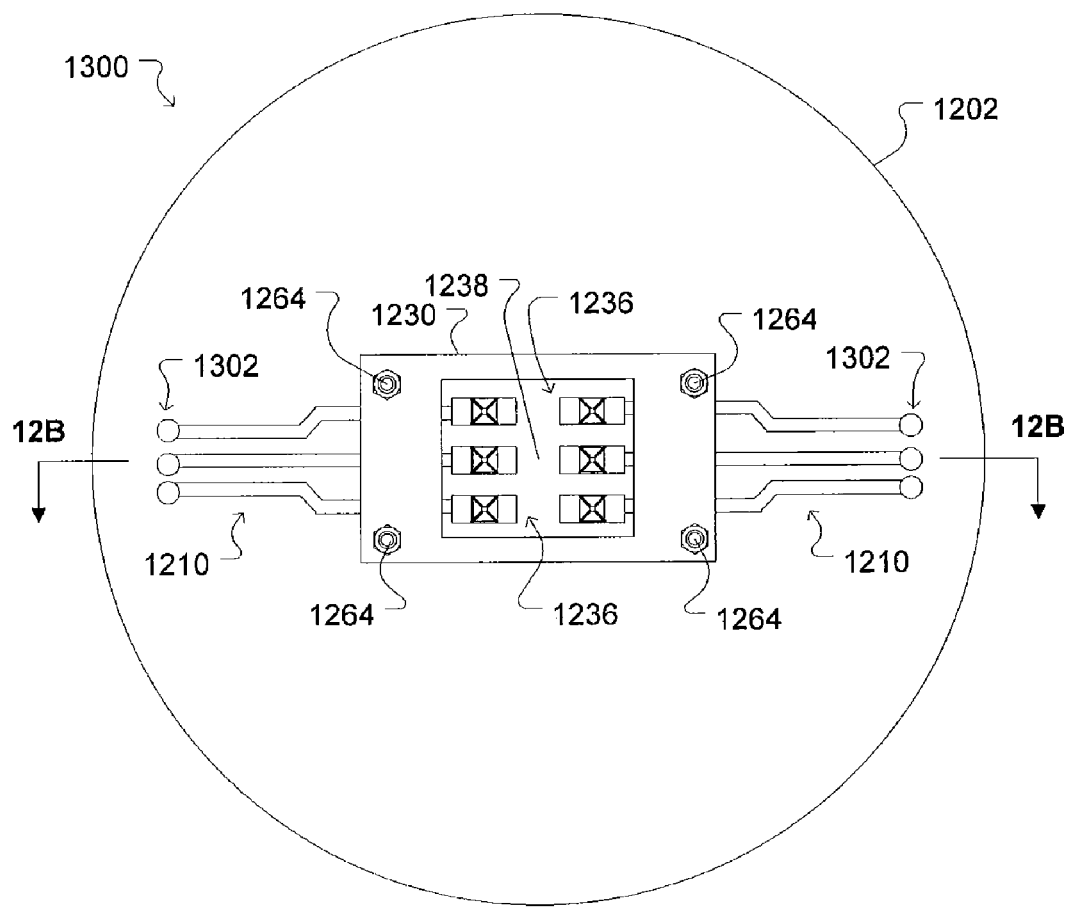
FIG. 17A illustrates a top view of yet another exemplary probe card assembly according to some embodiments of the invention.
Figure 17B:
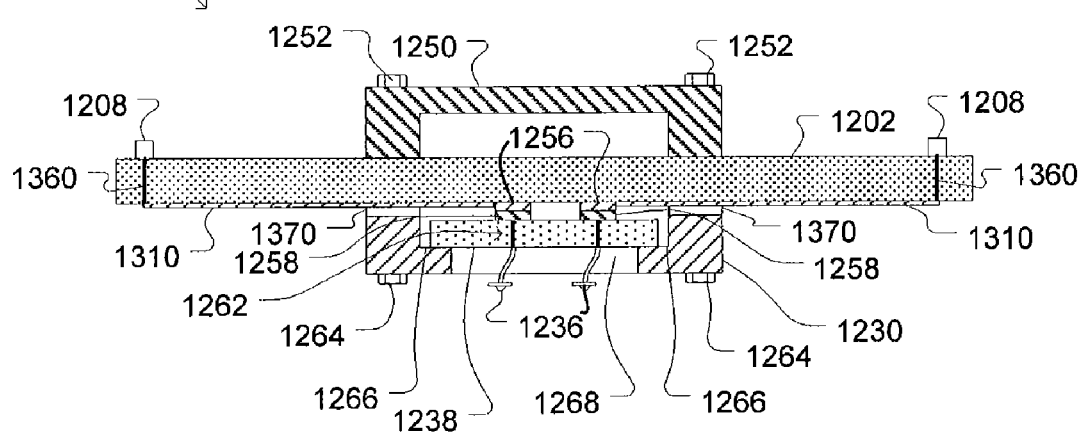
FIG. 17B illustrates a side, cross-sectional view of the probe card assembly of FIG. 17A.

FIGS. 17A and 17B show yet another exemplary probe card assembly 1300, which can be generally similar to probe card assembly 1200, and in fact, like numbered elements in probe card assembly 1200 and probe card assembly 1300 are the same. In probe card assembly 1300, however, electrically conductive vias 1360 electrically connect the channel connectors 1208 with electrically conductive traces 1310 disposed along the lower surface of the wiring substrate 1202. Traces 1310 pass through passages 1370 in the insert holder 1230 and connect to the conductive pads 1256 on the lower surface of the wiring board 1202.

Figure 18:
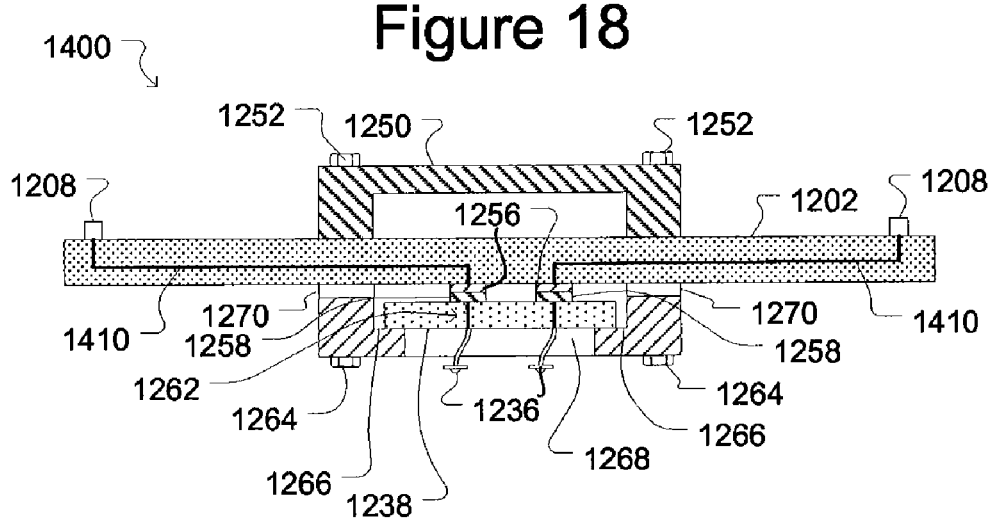
FIG. 18 illustrates a side, cross-sectional view of still another exemplary probe card assembly according to some embodiments of the invention.

FIG. 18 illustrates a side cross-sectional view of yet another exemplary probe card assembly 1400, which can be generally similar to probe card assemblies 1200 and 1300 (like numbered elements are the same) except that channel connectors 1208 are electrically connected to pads 1256 on the lower surface of the wiring substrate 1202 by conductive paths 1410 that comprise electrically conductive vias and traces embedded within wiring substrate 1202.

Figure 19:
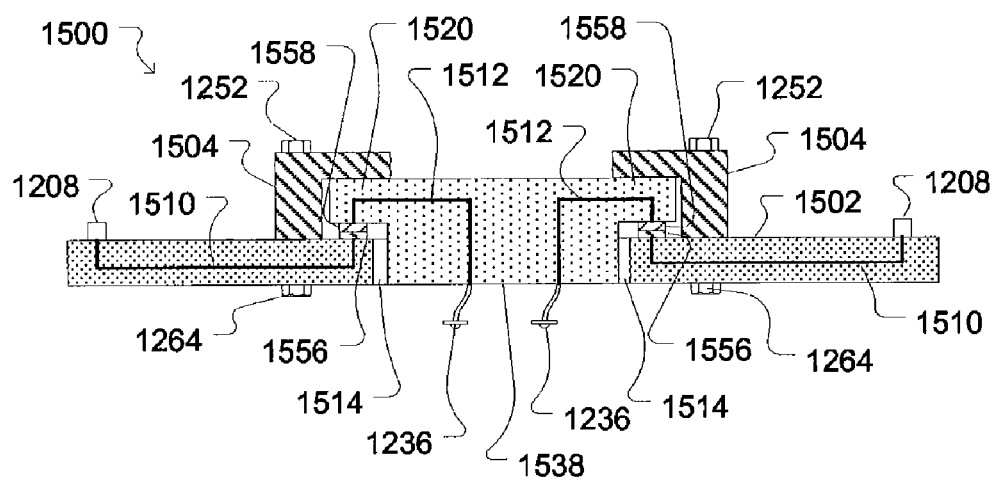
FIG. 19 illustrates a side, cross-sectional view of another exemplary probe card assembly according to some embodiments of the invention.

FIG. 19 illustrates an additional exemplary probe card assembly 1500, which can include channel connectors 1208 and probes 1236 that are the same as like number elements in probe card assemblies 1200, 1300, and 1400. Although otherwise similar to wiring substrate 1202, wiring substrate 1502 of probe card assembly 1500 can include an opening 1514 into which fits insert 1538. As shown in FIG. 19, insert 1538 fits into opening 1514 in the wiring substrate 1502 such that probes 1536 extend out of the opening 1514. Electrically conductive pads 1558 disposed on shoulders 1520 of the insert 1538 rest on, and thereby make electrical connections with, electrically conductive pads 1556 on the wiring substrate 1502. As also shown in FIG. 19, electrical paths 1510 comprising conductive vias and traces disposed within wiring substrate 1502 electrically connect channel connectors 1208 to pads 1556, and electrical paths 1512 comprising conductive vias and traces disposed within the insert 1538 electrically connect pads 1558 with probes 1236. Brackets 1504, which can be bolted to the wiring substrate 1502 by bolts 1264 and nuts 1252, hold the insert 1538 in place against the wiring substrate 1502.

Insert 1538 can be replaced by loosening bolts 1264 and removing insert 1238. A new insert 1538' may then be disposed within opening 1514 in the wiring substrate 1502, after which bolts 1264 can be tightened to hold the new insert 1538' in place.

Figure 20:
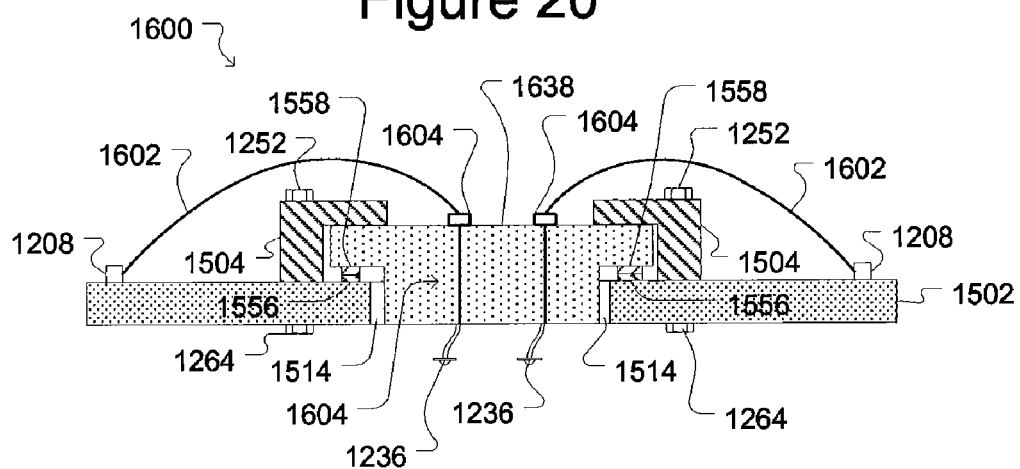
FIG. 20 illustrates a side, cross-sectional view of still another exemplary probe card assembly according to some embodiments of the invention.

FIG. 20 illustrates still another exemplary probe card assembly 1600, which can be generally similar to probe card assembly 1500 (like numbered elements are the same). In probe card assembly 1600, however, electrically conductive vias 1604 electrically connect probes 1236 with electrically conductive pads 1604 on insert 1638, and electrically conductive wires 1602 electrically connect pads 1604 with channel connectors 1208.

In FIGS. 16B, 17B, and 18, the electrical connection between pads 1256 and 1258 may be formed by including resilient electrical connectors (e.g., pogo pins, conductive elastomers, conductive fuzz buttons, conductive springs, wires each bonded at one end to a pad and having a compliant deformity that the other end, compliant bellows contacts, etc.) (not shown) between pads 1256 and 1258. Similarly, in FIGS. 19 and 20, the electrical connection between pad pairs 1558 and 1556 may be made using resilient electrical connectors (e.g., pogo pins, conductive elastomers, conductive fuzz buttons, conductive springs, etc.) (not shown).

Figure 21:
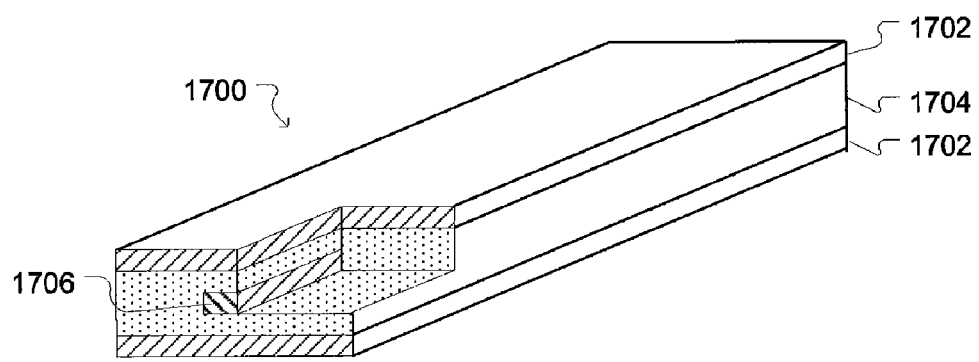
FIGS. 21-24 illustrate exemplary shielded signal traces according to some embodiments of the invention.
Figure 22:
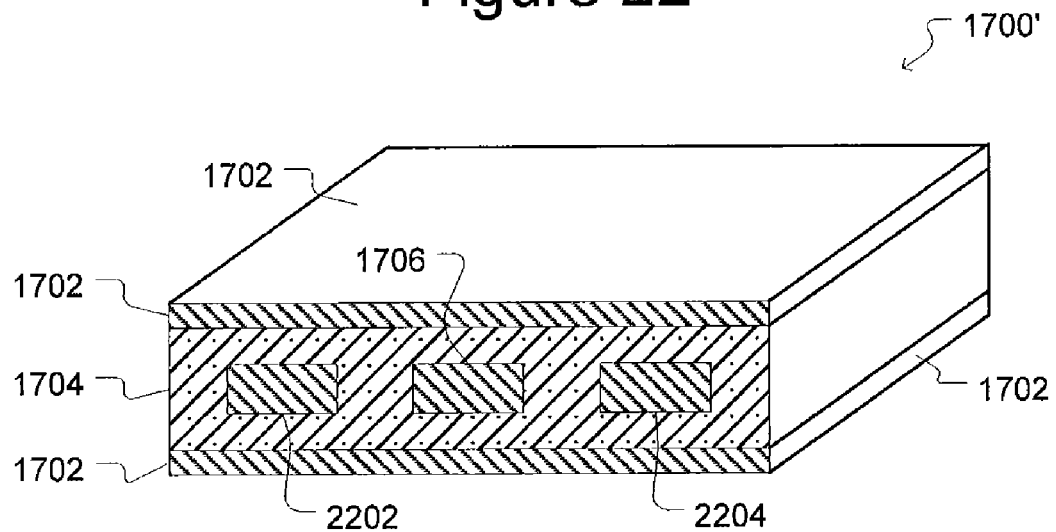

FIG. 21 illustrates a shielded trace 1700 that may be used in place of any of the electrically conductive traces and/or vias shown in any of exemplary probe card assemblies 200, 1200,

1300, 1400, 1500, or 1600 disclosed herein. As shown in FIG. 21, trace 1700 can include an electrically conductive signal trace 1706 for carrying a data or control signal. Electrically conductive planes 1702, which may be connected to ground, a guard potential, or a voltage source (not shown), electrically shield the signal trace 1706. Insulating material 1704 electrically insulates the signal trace 1706 from the planes 1702. As an alternative, multiple signal traces 1706 may be disposed between plates 1702. As yet another alternative, grounded or guard potential traces 2202, 2204 may be disposed within insulating material 1704 on either side of signal trace 1706 to further shield signal trace 1706 as shown in FIG. 22 (which illustrates shielded trace 1700').

Figure 23:
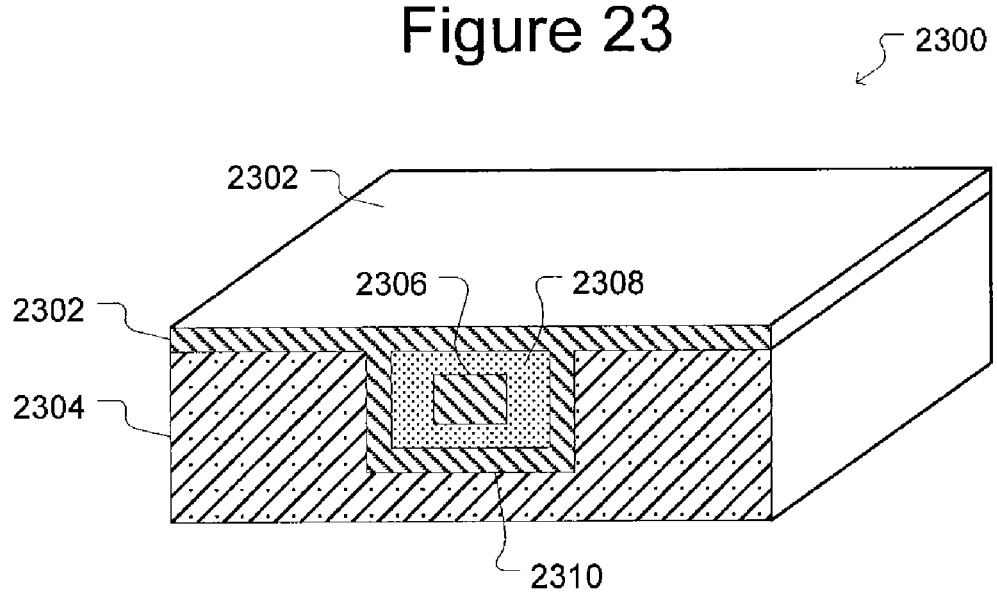
Figure 24:
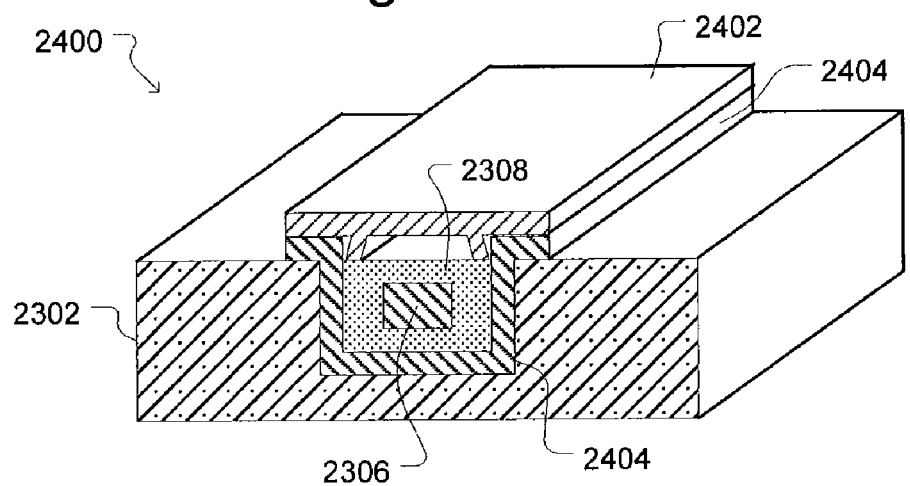

FIGS. 23 and 24 illustrate other exemplary shielded traces 2300, 2400 that may be used in place of any of the electrically conductive traces and/or vias shown in any of exemplary probe card assemblies 200, 1200, 1300, 1400, 1500, or 1600 disclosed herein. In FIG. 23, a signal trace 2306 (which may be like signal trace 1706) can be embedded within insulating material 2308, which in turn, can be surrounded by conductive plate 2302 and conductive box structure 2310, shielding signal trace 2306. Conductive box 2310, insulating material 2308, and signal trace 2306 may be embedded in a substrate 2304, which may comprise a printed circuit board. FIG. 24 shows a variation of trace 2300 of FIG. 23. In FIG. 24, signal trace 2306, which can be surrounded by insulating material 2308, can be shielded by a conductive box structure 2404 and a conductive covering structure 2402.

Figure 25:
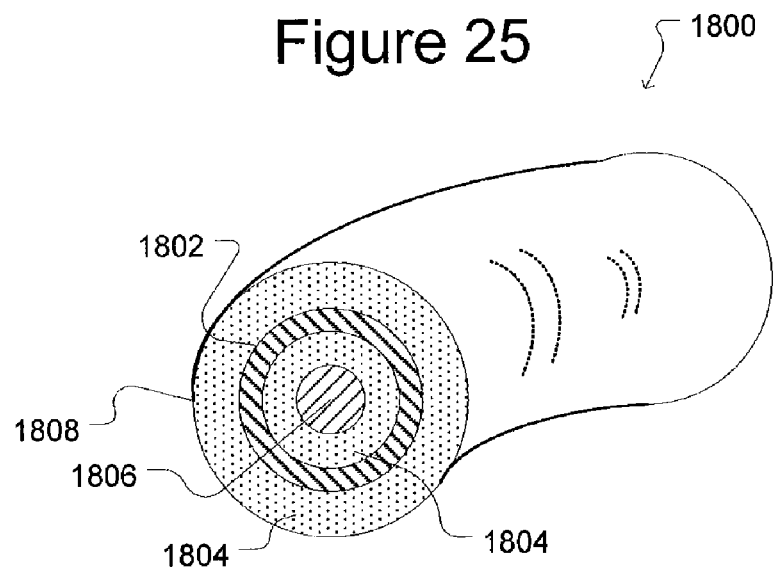
FIG. 25 illustrate an exemplary shielded wire according to some embodiments of the invention.

FIG. 25 illustrates a shielded wire 1800 that may be used in place of any of the electrically conductive wires shown in any of exemplary probe card assemblies 200, 1200, 1300, 1400, 1500, or 1600 disclosed herein. As shown in FIG. 22, shielded wire 1800 can include an electrically conductive signal line 1806 for carrying a data or control signal. An electrical conductor 1802, which may be connected to ground or a guard potential, surrounds the signal line 1806 and thus electrically shields the signal line 1806. Insulating material 1804 electrically insulates the signal line 1806 from conductor 1802. A protective jacket 1808 protects the wire 1800. Shielded wire 1800 may be, for example, a coaxial cable.

By utilizing shielded traces 1700, 1700', 2300, 2400 and/or shielded wires 1800 in the embodiments of a probe card assembly 200, 1200, 1300, 1400, and 1500, the operating frequency of those probe card assemblies can be increased. Thus, when such probe card assemblies are used to run functional tests on DUTs, the use of shielded traces 1700, 1700', 2300, 2400 and/or wires 1800 increases the maximum frequency at which the tests can be run. The use of shielded traces 1700, 1700', 2300, 2400 and/or shielded and/or guard potential wires 1800 also increases sensitivity to certain parametric tests, such as the detection of leakage current in the DUT. Thus, for example, when such probe card assemblies are used to run parametric tests on DUTs, the use of shield traces 1700, 1700', 2300, 2400 and/or wires 1800 can allow for the detection of very small leakage currents.

Although specific embodiments and applications of the invention have been described in this specification, there is no intention that the invention be limited to these exemplary embodiments and applications or to the manner in which the exemplary embodiments and applications operate or are described herein. For example, screws 470 of FIGS. 5 and 6A-6D may be replaced with bolts (not shown) that extend through holes in the pin holder 218, spacer 252, and adjustment plate 206 to engage nuts (not shown). As another example, small additional wells (not shown) may be included around the periphery of the top of opening 234 in the insert holder 230 to facilitate removing probe insert 238 from the opening 234. As still another example, the positions of bolts and nuts shown herein (e.g., bolts 1264 and nuts 1252) may be reversed. As still further examples, the specific configurations of the embodiments shown herein may be modified by, for example, modifying elements of the embodiments, adding additional elements, or deleting elements. For example, the probe card assembly 200 of FIG. 2 may be configured without stiffener 204. Still further modifications include configuring probe card assembly 200 to allow multiple probe inserts (e.g., each like probe insert 238) to be attached to the probe card assembly and providing mechanisms that allow the position, orientation, and/or location of each such probe insert to be adjusted independently of the other probe inserts. A probe insert (e.g., like probe insert 238) can be configured to contact more than one DUT or less than an entire DUT.

What is claimed is:

1. A method of reconfiguring a probe card apparatus, the method comprising:
   decoupling from a probe card assembly an insert holder, the insert holder comprising an opening from an upper surface to a lower surface of the insert holder and a ledge in the opening between the upper surface and the lower surface, there being a first probe insert disposed on the ledge in the opening such that probes of the first probe insert disposed in a first configuration extend out of the opening beyond the lower surface; and
   removing the first probe insert from the insert holder;
   placing a second probe insert comprising probes disposed in a second configuration on the ledge such that the probes of the second probe insert extend out of the opening beyond the lower surface; and
   coupling the insert holder with the second probe insert disposed on the ledge to the probe card assembly,
   wherein the second configuration is different than the first configuration.

2. The method of claim 1, wherein:
   in the first configuration, the probes are disposed to contact a first configuration of terminals that correspond to a first semiconductor die design,
   in the second configuration, the probes are disposed to contact a second configuration of terminals that correspond to a second semiconductor die design, and
   the first configuration of terminals is different than the second configuration of terminals.

3. The method of claim 1, wherein the decoupling step comprises:
   securing the holder in a holding tool, and
   thereafter releasing the holder from the probe card assembly.

4. The method of claim 3, wherein the releasing step comprises removing attaching mechanisms that hold the holder to the probe card assembly.

5. The method of claim 4, wherein the releasing step further comprises accessing the attaching mechanisms through the holding tool.

6. The method of claim 1, wherein the coupling step comprises:
   securing the holder in a holding tool, and
   thereafter attaching the holder to the probe card assembly.

7. The method of claim 6, wherein the coupling step further comprises accessing attaching mechanisms through the holding tool.

8. The method of claim 1, wherein:
   the probe card assembly comprises an electrical interface to a tester,
   the decoupling step comprises disconnecting the probes of the first probe insert from the tester interface, and the coupling step comprises connecting the probes of the second probe insert to the tester interface.

9. The method of claim 1, wherein:

the probe card assembly comprises electrically conductive contacts that extend from toward the opening in the insert holder while the insert holder is coupled to the probe card assembly, the decoupling step comprises disconnecting the probes of the first probe insert from the contacts, and the coupling step comprises connecting the probes of the second probe insert to the contacts.

10. The method of claim 9, wherein:

the contacts are disposed on a particular structural element of the probe card assembly, the decoupling step comprises detaching the first probe insert from the particular structural element, and the coupling step comprises attaching the second probe insert to the particular structural element.

11. The method of claim 10, wherein the probe card assembly comprises a wiring substrate comprising channel connectors for making electrical connections with communications channels from the tester.

12. The method of claim 11, wherein the particular structural element comprises a holding mechanism configured to hold the contacts, wherein the contacts are electrically connected to the channel connectors.

13. The method of claim 11, wherein the particular structural element comprises the wiring substrate.

14. The method of claim 1, wherein:

the decoupling step comprises removing attachment mechanisms that attach the insert holder to the probe card assembly with the upper surface of the insert holder facing the probe card assembly and the lower surface of the insert holder facing away from the probe card assembly; and the decoupling step comprises replacing the attachment mechanisms.

15. The method of claim 14, wherein the attachment mechanisms comprise bolts that pass through holes in the insert holder from the lower surface to the upper surface and extend into the probe card assembly.

* * * * *